United States Patent [19]
Koenig et al.

[11] Patent Number: 5,729,463
[45] Date of Patent: Mar. 17, 1998

[54] DESIGNING AND PRODUCING LIGHTWEIGHT AUTOMOBILE BODIES

[75] Inventors: Gerhard Koenig, Birmingham; Robert Koehr, Mt. Clemens; Felix Kybart, Birmingham, all of Mich.; Sigfried Walter, Leonberg, Germany; John Catterall, Troy; John Krumbach, Plymouth, both of Mich.; Rolf Heyll, Renningen, Germany; Andrew Wolf, Parkland, Fla.

[73] Assignee: ULSAB Trust, Washington, D.C.

[21] Appl. No.: 522,676

[22] Filed: Sep. 1, 1995

[51] Int. Cl.$^6$ .................................................. G06F 19/00
[52] U.S. Cl. ............... 364/468.04; 364/425; 364/474.24; 364/578
[58] Field of Search ............... 364/468.03, 468.04, 364/468.13, 468.15, 468.24, 474.24, 578, 425, 550, 551.01; 395/964, 119, 120

[56] References Cited

U.S. PATENT DOCUMENTS

| | | | |
|---|---|---|---|
| 5,033,014 | 7/1991 | Carver et al. | 364/474.24 X |
| 5,251,161 | 10/1993 | Gioutsos et al. | 364/578 |
| 5,345,402 | 9/1994 | Gioutsos et al. | 364/578 |
| 5,481,465 | 1/1996 | Itoh et al. | 364/468.25 |

Primary Examiner—Joseph Ruggiero
Attorney, Agent, or Firm—Brooks & Kushman

[57] ABSTRACT

Method and system for designing and producing a lightweight automobile or vehicle body. Structural performance targets are selected, a beam model analysis is conducted, and a body-in-white design is developed. A shell model is created and analyzed and material gauges and manufacturing processes for the body components are selected. A structural analysis is conducted to determine whether the shell model meets the selected structural performance targets. A crash model is created, analyzed, and modified until satisfactory crash requirements are met. A final structural analysis is conducted to determine whether the shell model meets the selected structural performance targets.

31 Claims, 25 Drawing Sheets

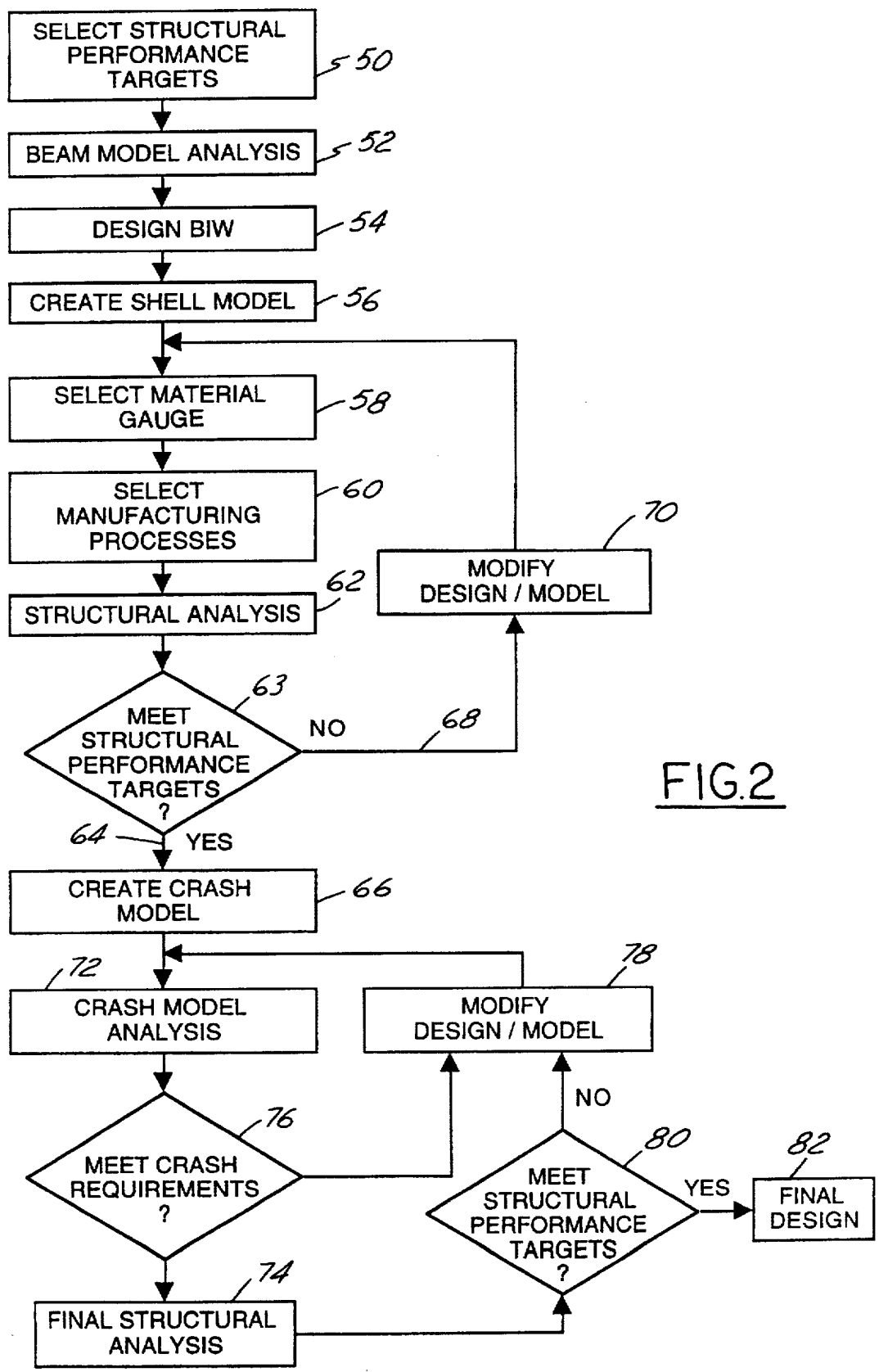

SHELL MODEL ANALYSIS

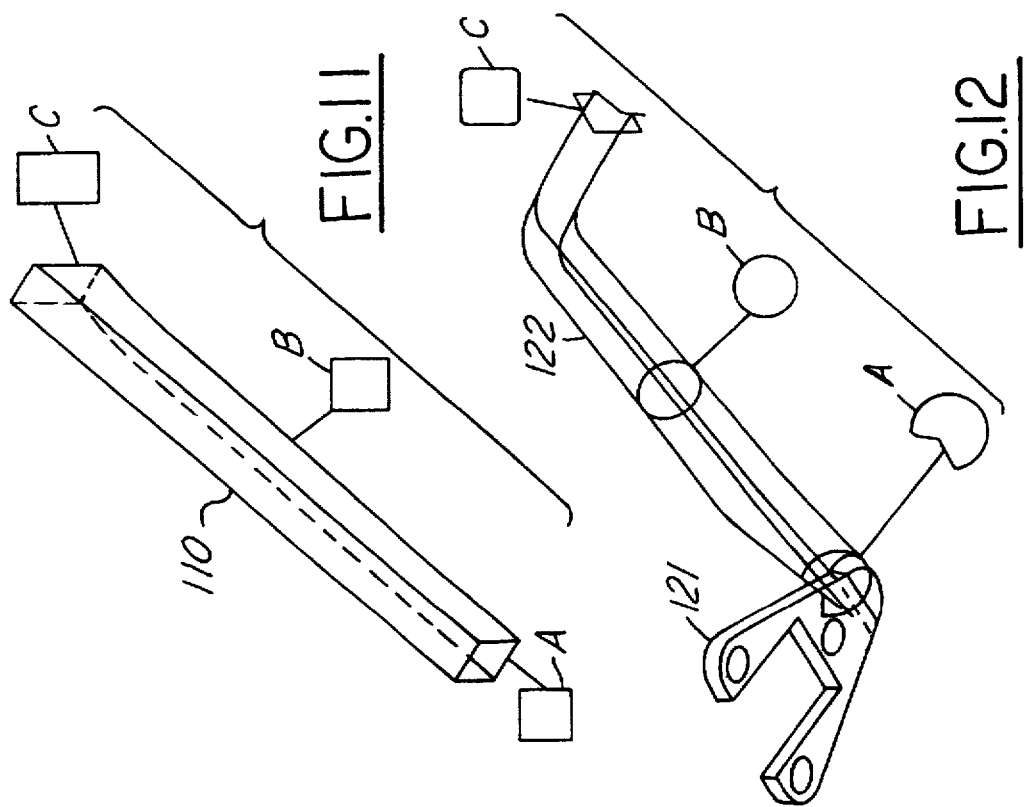
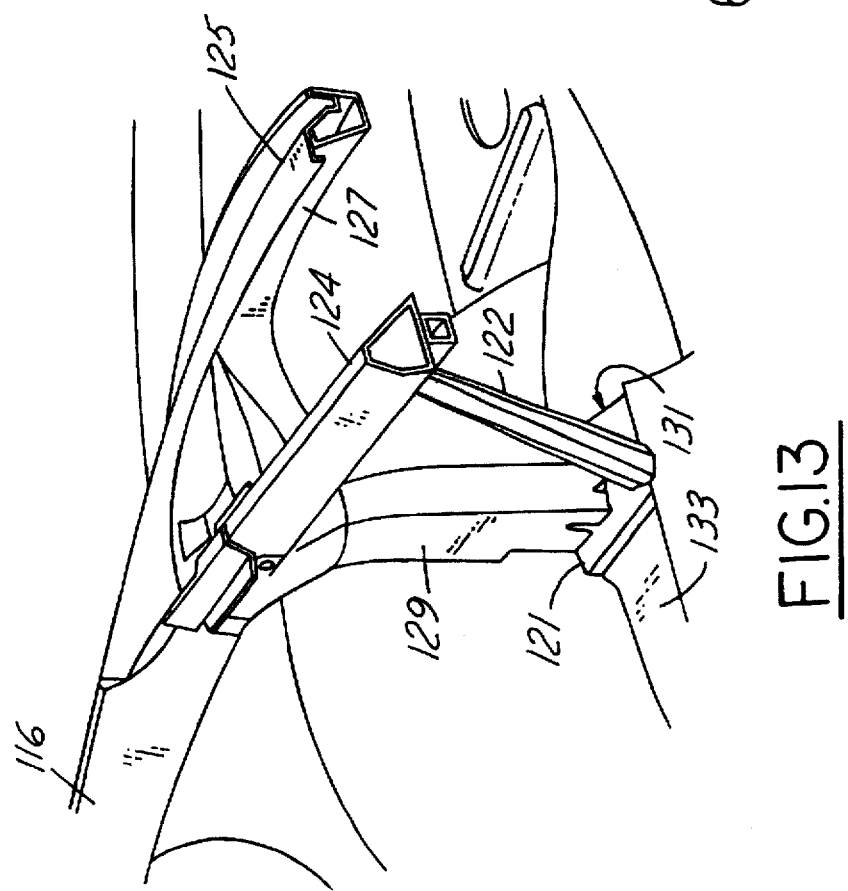

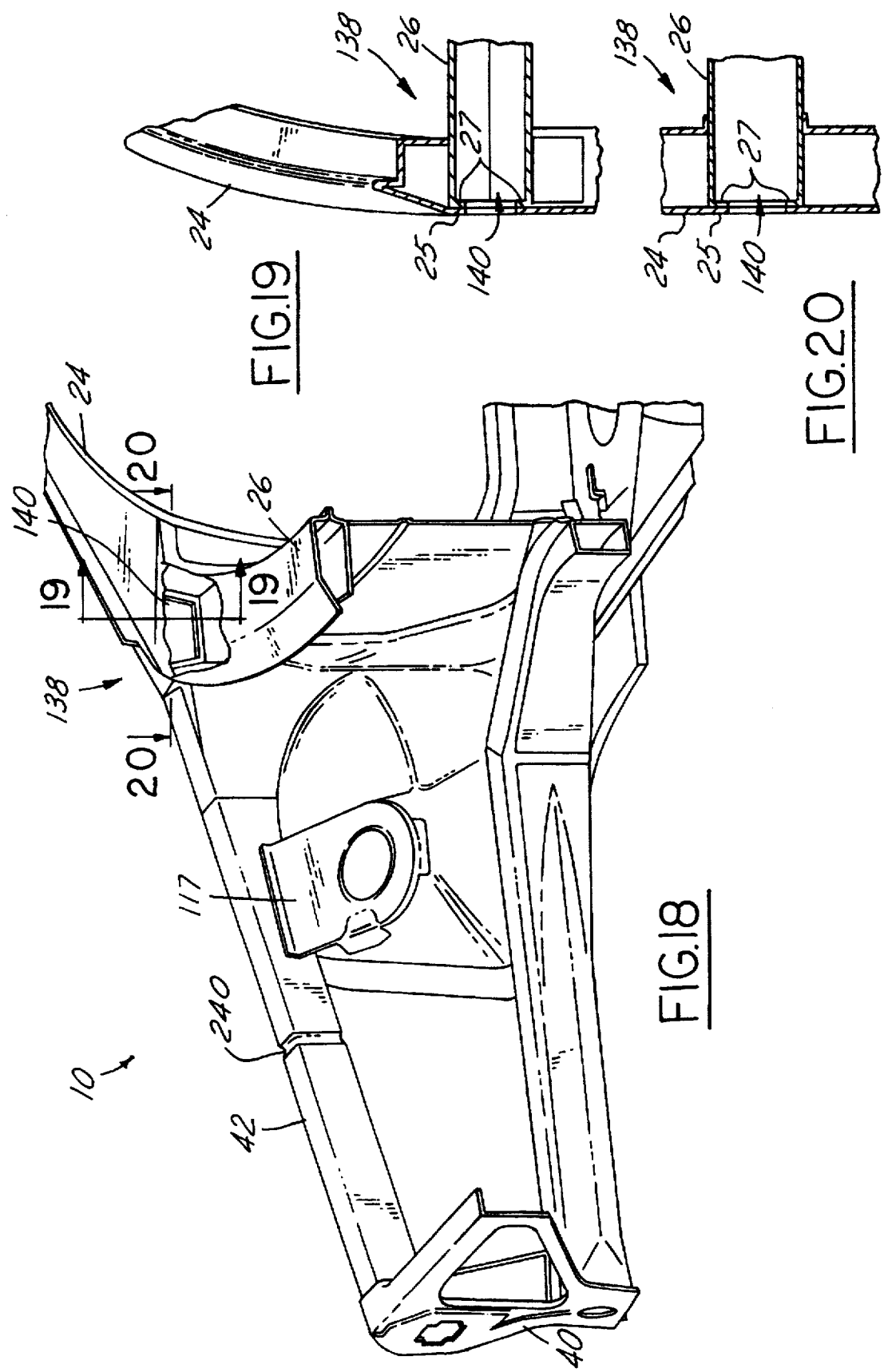

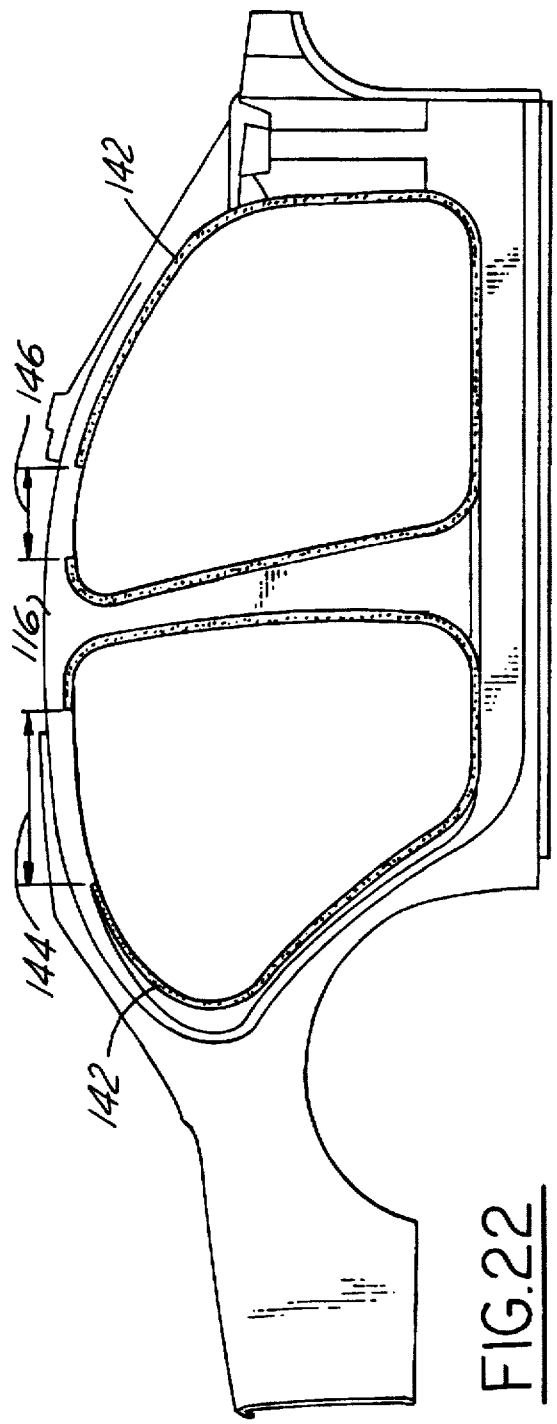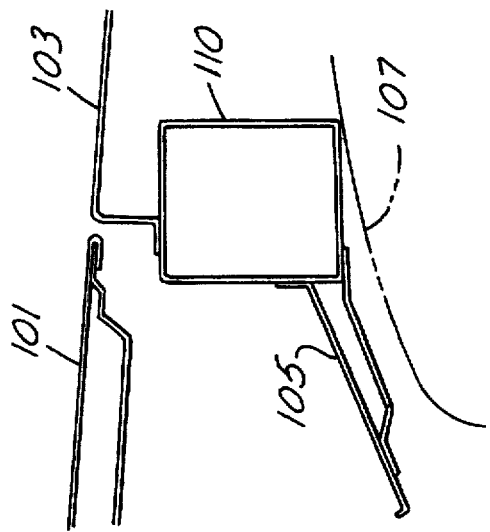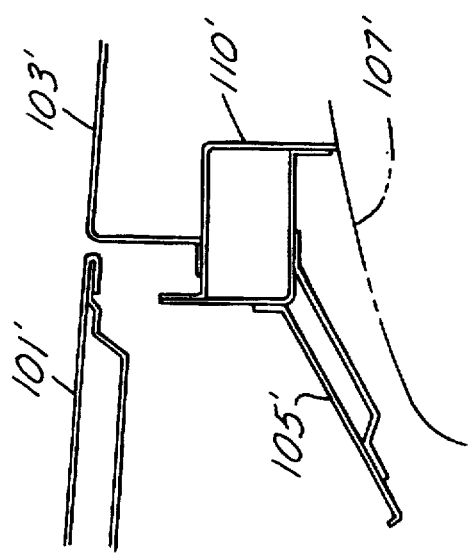

DESIGNING AND PRODUCING LIGHTWEIGHT AUTOMOBILE BODIES

TECHNICAL FIELD

The present invention relates to lightweight automobile bodies, and more particularly to processes and system for designing and developing automobile bodies which are improved and lighter in weight than those known today.

BACKGROUND ART

Automobile and vehicle manufacturers today are striving to achieve fuel economy standards and meet global competition. The fuel standards have been generally imposed for health and environmental reasons.

In order to meet those goals, the automobile and vehicle manufacturers have developed various solutions. These solutions include improved engine and power train technology, lower rolling resistance tires, better vehicle aerodynamics, and reduced overall vehicle weight.

The reduction of vehicle weight has taken many approaches. These solutions include reducing the number of individual parts of a vehicle, incorporating new manufacturing techniques, substituting lower density materials for higher density materials, using lighter weight materials, redesigning parts to reduce their weight, down-sizing the vehicle and/or its individual components, and applying design techniques that result in more efficient structures and use of materials.

The majority of parts for most automobiles and other vehicles are made from steel materials. Steel has many proven advantages, such as low cost, excellent manufacturability, recyclability, and crash energy management capability. The redesign of steel parts and the ability to make the parts from various types, gauges, and strengths of steel materials, have helped create automobiles and vehicles having lower overall vehicle weight and thus having improved fuel economy and lower undesirable emissions.

In efforts to reduce the weight of vehicles, the parts and components of various vehicles have been made from aluminum, synthetic materials (e.g. plastic), composites and other lightweight materials. Some of these efforts have been successful, although other problems have often resulted, such as increased costs, difficulty of manufacturing, difficulty of recycling, inability to be mass produced and deficiencies in crash worthiness. Some vehicles have combined parts and components of various materials, but again have had problems and concerns which have not always balanced the weight savings.

The body shell of a vehicle (a/k/a "body-in-white") is the skeletal structure to which various subsystems subsequently are attached, such as the engine and drive train, suspension and wheels, interior components, and exterior body components, such as the doors, hood and trunk lid. The body-in-white (BIW) typically represents approximately 20–25% of the total weight of a vehicle. If the weight of the BIW is reduced, then the subsystems, engine, wheels, drive train, and the like could also be downsized and/or light-weighted which would further reduce the weight of the overall vehicle and in turn increase fuel economy, decrease undesirable emissions, and decrease cost.

It is an object of the present invention to provide a vehicle which is lighter in weight than known comparable vehicles today. It is another object of the present invention to provide an automobile or vehicle body which is made from one or more types of conventional materials and has a lighter weight than known designs.

It is a further object of the present invention to provide automotive and vehicle bodies-in-white which are lighter in weight than those known today and still meet satisfactory standards of structural integrity, crash worthiness and durability. It is still another object of the present invention to provide an improved process and system for designing light-weight vehicle bodies.

It is a still further object of the present invention to provide an improved light-weight vehicle or automobile body which has improved structural components and combinations thereof. It is another object of the present invention to provide a vehicle or automobile body which has improved A-pillar and rear deck constructions.

It is a further object of the present invention to provide a reduced weight body-in-white preferably made from steel materials and which meets satisfactory structural and functional performance standards.

These and other objects, purposes and advantages of the present invention will become apparent from the following description thereof, when viewed in accordance with the attached drawings and appended claims.

SUMMARY OF THE INVENTION

The present invention includes an improved system and process for designing an automobile or vehicle body which has a substantial weight-savings over comparable known automobile and vehicle bodies. A total vehicle analysis or holistic design approach is utilized. The complete structure is examined and localized rigidity deficiencies are improved with redesign. With the rigidity deficiencies solved, weight is taken out of the total system, leaving strength and weight where it is needed and removing it where it is not needed. The invention provides satisfactory structural efficiency and rigidity at the lowest possible weight for the vehicle body.

Certain structural performance targets are first selected for the light-weight vehicle body. These targets include the mass (weight) of the body, as well as static torsion, static bending and first mode of vibration (frequency). The type of material used for the vehicle body is also selected, such as steel, aluminum, plastic, composites, etc.

Based on the specified structural performance targets, a computerized finite element beam model analysis is carried out to secure locations and cross-sections of performance for each of the components of the vehicle and utilizing the selected materials. A body-in-white is then developed from the data secured in the beam model analysis. From this a finite element shell model is created as a working tool and analyzed. Loads are applied to the shell model, including static torsion, static bending, front unit crash load, rear unit crash load and free-free normal mode. The global body modes also are examined and design sensitivity analysis is performed. From this analysis, the joints, optimum gauges of the material and the manufacturing processes for the various body parts to achieve a minimum mass of the body are then selected.

The design of the vehicle is then analyzed and compared with other design approaches by considering the structural efficiency stiffness per unit mass, displacement plots along the length of the body (static torsion and bending), stress and strain contour plots, and deformed shape plots on normal mode analysis.

Based on the sensitivity and gauge optimization analyses, and taking into account practical limits for size and thickness of the selected materials, a proposed optimum body-in-white is selected to meet the structural performance targets. From the analysis, body components and joints are redesigned where necessary and strengthened—or reduced in weight where appropriate. Also, the light-weight body can include parts made from different types of materials and produced by different manufacturing processes. The body can also include parts made of the same materials, but made with different manufacturing processes.

Once the BIW is found to meet the structural performance targets, a crash model is created and analyzed through various computerized simulated crash tests. The crash model is redesigned and modified until satisfactory crash requirements are met. A final structural analysis is subsequently carried out and revisions are made to the model or design where necessary and/or appropriate. From this process, a final low-weight body-in-white design which meets the prespecified load and manufacturing requirements is achieved.

In accordance with the present invention, depending on the materials used for the body-in-white components, the manufacturing steps and processes for each of the components are selected. The steps and processes for assembling all of the components together to form the BIW are also selected. If the body-in-white is made from steel materials, then the type and strength of the steel for the components is selected, as well as the process for manufacture of each of the components (e.g. stamped, roll-formed, hot-formed, tailor blanked, hydroformed, etc.). The processes for completion and assembly of the various components are also selected, such as spot-welding, laser-welding, etc.

The A-pillar construction can be strengthened by passing the dash cowl member through the A-pillar. Also, the package tray can be strengthened by providing a combination of a hydroformed pass-through beam and a roll-formed cross-member, together with a strengthened support on the rear shock tower.

With the present invention, a highly rigid body with minimal mass is created. The competing requirements of safety (crash worthiness), rigidity, cost and weight reduction are balanced and new and improved bodies-in-white for automotive and other vehicles are created. The bodies-in-white have tight packages with minimal outer space and maximum internal usable space, and meet customer and manufacturer needs of comfort, manufacturing efficiency, fuel efficiency, and safety.

In addition, the techniques used for manufacture and assembly of the body-in-white and its components are preferably those in use today, or which are in the process of being developed. In this manner, the invention can have immediate use and application and the benefits thereof can be promptly provided to and secured by manufacturers, their customers, and other members of the public.

BRIEF DESCRIPTION OF THE DRAWINGS

FIG. 2 is a flow diagram illustrating the preferred process and system in accordance with the present invention;

FIG. 8 is an exploded view of a body-in-white developed in accordance with the present invention;

FIG. 11 illustrates an upper fender rail for use in accordance with the present invention;

FIG. 12 illustrates a pass-through beam for use in accordance with the present invention;

FIG. 13 illustrates a package tray structure for use in accordance with the present invention;

FIG. 18 illustrates an A-pillar joint assembly made in accordance with the present invention;

FIGS. 19 and 20 are cross-sectional views of the A-pillar joint assembly shown in FIG. 18, the cross sections being taken along lines 19—19 and 20—20, respectively, in FIG. 18 and in the direction of the arrows;

FIG. 22 depicts the weld bonding feature utilized on the inventive body-in-white;

FIGS. 23A and 23B compare the use of stamped fender rail components and hydroformed fender rail components, respectively;

BEST MODE FOR CARRYING OUT THE INVENTION

The present invention pertains generally to the reduction of weight in a vehicle or automotive body and more particularly to a lighter-weight body-in-white (BIW) structure for a vehicle or automobile. The present invention can be used with any metal, synthetic or composite materials, but preferably utilizes steel due to its proven advantages, such as low cost, excellent manufacturability, recyclability and crash energy management capability.

The system uses a total vehicle analysis, that is a holistic design approach. The complete structure is examined to see where localized stiffness deficiencies could be improved with redesign, even by adding weight. With body-in-white stiffness deficiencies satisfied, weight is then taken out from the total system, leaving strength and weight where it is needed and removing it where it is not needed.

The present invention was developed in association with the development of a five passenger four-door sedan, but the same process could be utilized relative to any style or type of vehicle or automotive body. Also, for convenience, the term "vehicle body" herein will be used in place of the longer phrase "automotive and vehicle body", and refers to any automotive, truck or other vehicle body.

The invention, as disclosed and described herein, is particularly related to the design and development of a light-weight body-in-white for a five passenger four-door sedan. Vehicles of this type on the market today include the Ford Taurus, Mazda 929, Honda Accord, Chevrolet Lumina, Accura Legend, Lexus LS400, Toyota Cressida, Mercedes 190E and the BMW "5" Series. In addition, certain structural performance targets were selected for the new light-weight vehicle body. These targets included a certain mass or weight, certain static torsion and bending standards, and certain modes of vibration (frequency).

Figure 1:
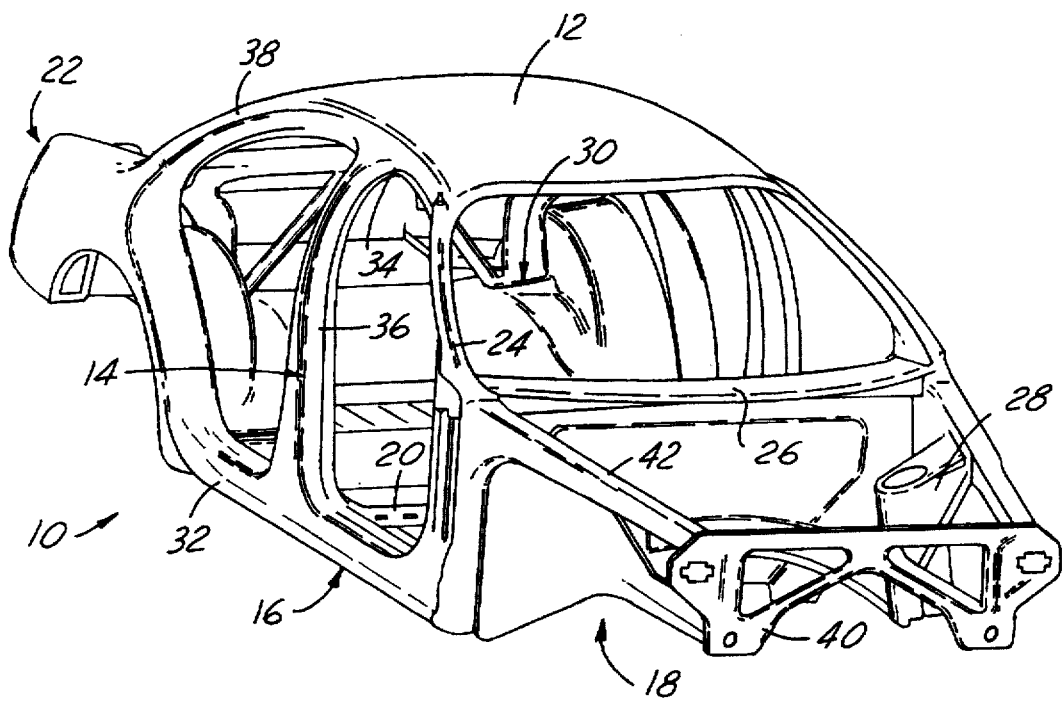
FIG. 1 illustrates a body-in-white made in accordance with the present invention.

A representative body-in-white configuration is shown in FIG. 1 and designated by the reference numeral 10. The body-in-white includes all of the major structural components of the vehicle body, but does not include any of the hardware, doors, glass, engine and power train, wheels, hood, trunk lid, bumpers and other internal or external accessories.

The body-in-white includes the roof 12, framing side 14, underbody 16, front end 18, floor member 20 and rear end 22. More specifically, the body-in-white also includes the A-pillar members 24, front dash cowl member 26, front shock towers 28, rear shock towers 30, rocker members 32, roof rail members 34, B-pillar members 36, C-pillar members 38, front end member 40, front upper rail member 42, and the like.

A flow chart which sets forth the basic components of the inventive system and process in accordance with the present invention is shown in FIG. 2. As indicated, the structural performance targets 50 are first selected. Thereafter, a computerized finite element beam model analysis 52 is performed and a body-in-white 54 is designed.

Thereafter finite element shell model 56 is created and the material gauges (thicknesses) 58 and their appropriate manufacturing processes 60 are selected in accordance with the shell model. An analysis 62 is also made to determine if the shell model meets the selected structural performance targets. The decision box relative to this analysis is referenced by the numeral 63. If the structural targets are met, then a candidate for the final design has been obtained and it is subjected to crash analysis. This step is represented by the arrow 64 and the word "YES". At that point a crash model 66 is created.

However, as is the case with most developmental processes, the desired structural performance targets are not met initially and the shell model is modified and redesigned. This is shown by arrow 68 and box 70. The shell model is redesigned and modified, new material gauges 58 and manufacturing processes 60 are selected for the new parameters, and the structural performance analysis 62 is repeated. If necessary, the process is repeated several times before the targets are met and the BIW is subjected to the crash analysis.

Once the crash model 66 is created, a crash model analysis 72 is carried out. That analysis involves the computerized simulated performance of several crash tests, as described below.

If the crash requirements are met, as shown by decision box 76, then a final structural analysis 74 is carried out. If the crash requirements are not met, then the crash model analysis is modified and redesigned. This is shown by box 78. Once the crash model is redesigned and modified, the crash analysis 72 is performed again. If necessary, the crash process is repeated several times before the targets are met and the BIW is subjected to the final structural analysis 74.

During the final structural analysis, it is determined whether the body-in-white meets all of the structural performance targets. This is shown by decision box 80. If the structural performance targets are not met, then the crash model is again modified or redesigned, as shown by box 78, and the crash model analysis 72 is repeated.

Once the body-in-white is determined to meet the structural performance targets, as shown by decision box 80, then the final design 82 has been obtained.

Figure 3:
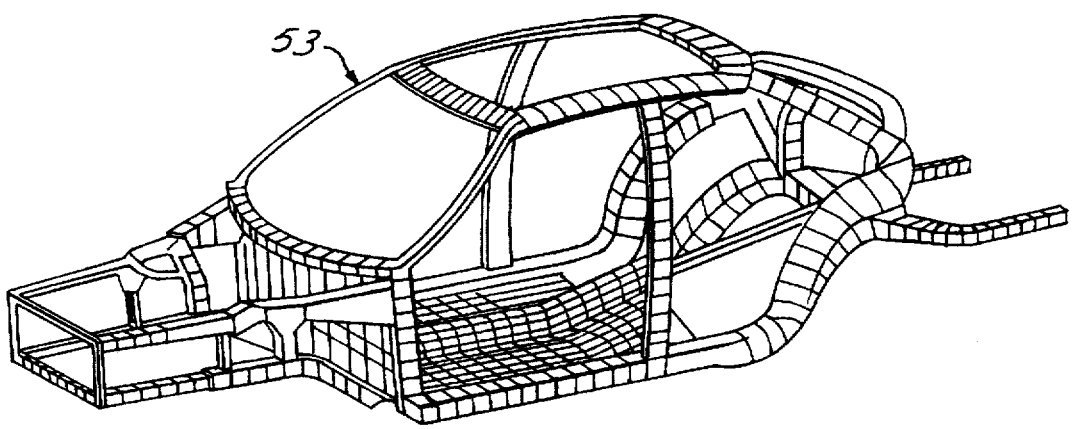
FIG. 3 depicts a beam model made in accordance with a beam model analysis in accordance with the present invention.

A typical finite element beam model design 53 created by a computerized beam model analysis is shown in FIG. 3. The beam model design and analysis defines the basic architecture for the vehicle body and is dependent on the material selected. The section properties for each beam are determined to maximize the structural performance of the design concept utilizing the selected material or materials.

The computer software used for the beam model 30 and shell model analyses is CSA/NASTRAN, which is run on IBM computer hardware, although any comparable computer software and hardware can be used. The various structural performance targets and specifications are loaded into the program and the computer specifies the initial architecture. Thereafter numerous revisions and iterations are made to take into account various load and stress factors until a suitable model is created.

The models were created from CAD line data, which included sections through each part every 100 mm. The model consisted of over 37,000 total elements and over 35,000 nodes for a half model. Element breakdown was as follows: CQUAD4 31,659, CTRIA3 2,259, CBAR 2,586, CELAS2 324 and RBE2 778. For element quality, the maximum warpage was 10°, the maximum aspect ratio was 10:1, the minimum interior angle CQUAD4 was 30°, the CTRIA was 10°, and the maximum skew was 45° Other comparable models could be created and utilized in accordance with the present invention.

The structural performance requirements are selected to secure a desired structural integrity for the vehicle as well as desired crash-worthiness, rigidity and durability. The main structural parts for the body-in-white are the front and rear shock towers, front rails, rear rails, rocker panel members, A-, B- and C-pillar members, cross dash panel member, front roof rail member, rear roof rail member, side roof rail member and hinge pillar member.

The mass of the benchmarked vehicles is adjusted in accordance with the projected areas and usable volumes of these vehicles. The wheel base of the target vehicle is also selected so that the requisite stiffness analysis can be made. Other factors taken into account in the design include the overall length and width of the body, front and rear head room, front and rear leg room, front and rear shoulder room, cargo volume, type of engine and drive train to be used with the vehicle, as well as the projected number of passengers.

A conceptual beam model, such as that shown in FIG. 3, is designed and constructed from the data secured from the beam structural performance data imputed into the computer program. The beam model analysis provides the locations and dimensions of the various components for the body-in-white. This analysis defines inertias and provides an indication of the cross-section performance for each component. The beam model is a computerized 3-D rigidity representation of the main body structure in accordance with the imputed data.

A body-in-white is then developed from the data developed from the beam model analysis. The inertia data facilitates the development of a mathematical design based on that data. The cross-section of each of the parts is designed to meet the inertia data.

In the design of the body-in-white, several design concepts of body styles are investigated to determine which is the most suitable for the particular vehicle and vehicle body under consideration. The design concepts include space frame, full frame, unibody, and hydroform intensive body structure. The space frame design approach utilizes tubular framing components, and is similar to the construction of race cars. The full frame body design is in use today for several heavy automobiles, as well as for trucks and similar vehicles. The unibody design approach typically utilizes all metal stamped parts and is in popular use for numerous vehicles today. The hydroform intensive body design approach utilizes as many hydroformed components as possible. Some hydroformed components are in use in vehicles today, but few if any are used as structural components.

Each of these body design concepts are analyzed with respect to beam and shell models that are created by computer analysis. Each body-in-white designed in accordance with a particular concept is analyzed to determine whether it meets the structural performance targets. If the targets are not met, the shell model and BIW are revised and modified as necessary in order to determine if the design concept can achieve the structural performance targets. Bodies made from a combination of these conventional design concepts also are investigated and analyzed to determine which concept or combination is the closest to or which has the most possibilities of meeting the targets. For combination designs, various parts and components of the vehicle body are provided from different design concepts.

Based on an analysis in accordance with the present invention, it has been found that with steel materials, a combination of unibody and hydroform intensive design concepts achieves the best results.

Figure 4:
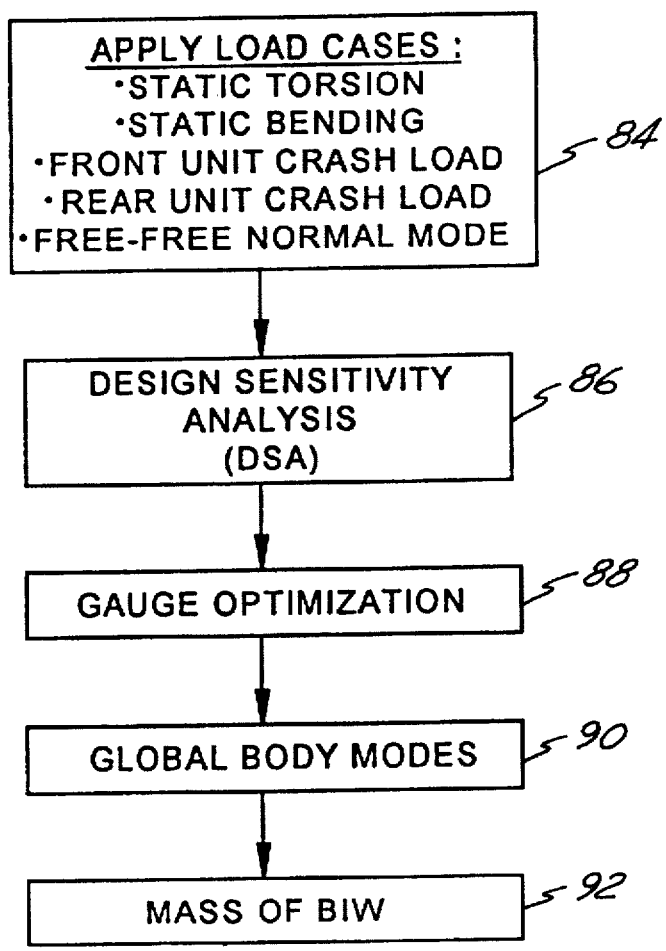
FIG. 4 is a flow diagram of a shell model analysis in accordance with the present invention.

The basic components of a shell model analysis are shown in FIG. 4. In the shell model analysis, five different load cases preferably are applied in order to secure requisite data. These applied load cases include static torsion, static bending, front unit crash load, rear unit crash load, and free-free normal mode. The step of applying load cases is referenced by the numeral 84 in FIG. 4. The shell model analysis also includes a design sensitivity analysis 86, gauge optimization 88, global body mode analysis 90, and body-in-white mass analysis 92.

Figure 5:
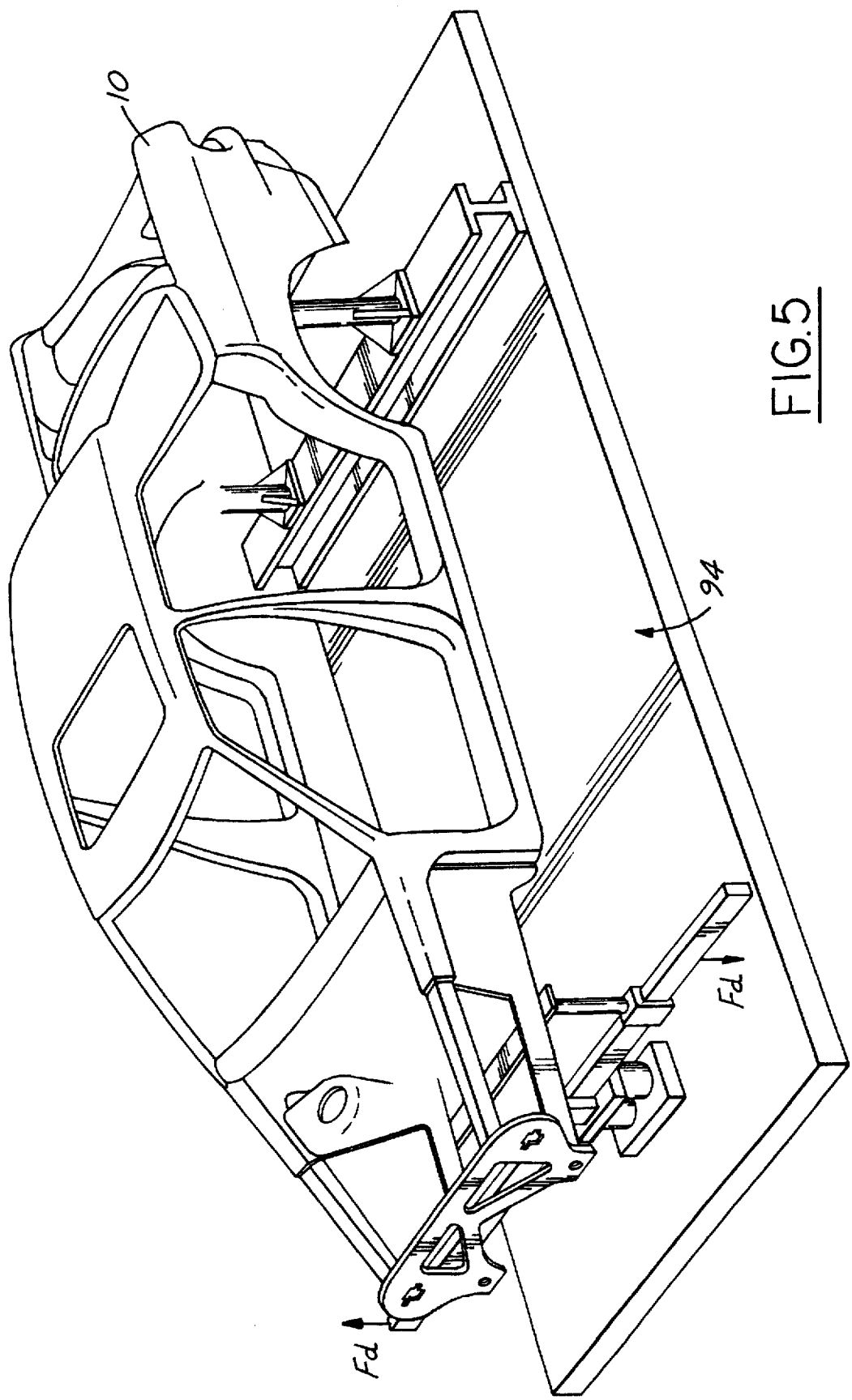
FIG. 5 illustrates a static torsion rigidity test.

For the static torsional rigidity test, a theoretical torsional test jig 94, as shown in FIG. 5 is utilized with the computer software. The conceptual body-in-white without doors, deck lids, closures, fenders or fascias, is analyzed as it would be attached to the test jig 94 at the front and rear shock towers. A torque is applied to the front shock towers as shown by the force $F_d$ and the vertical deflection is measured on the right and left side of the BIW relative to the longitudinal members. From this, the torsional displacement and the first derivation of the torsional displacement are secured.

Figure 6:
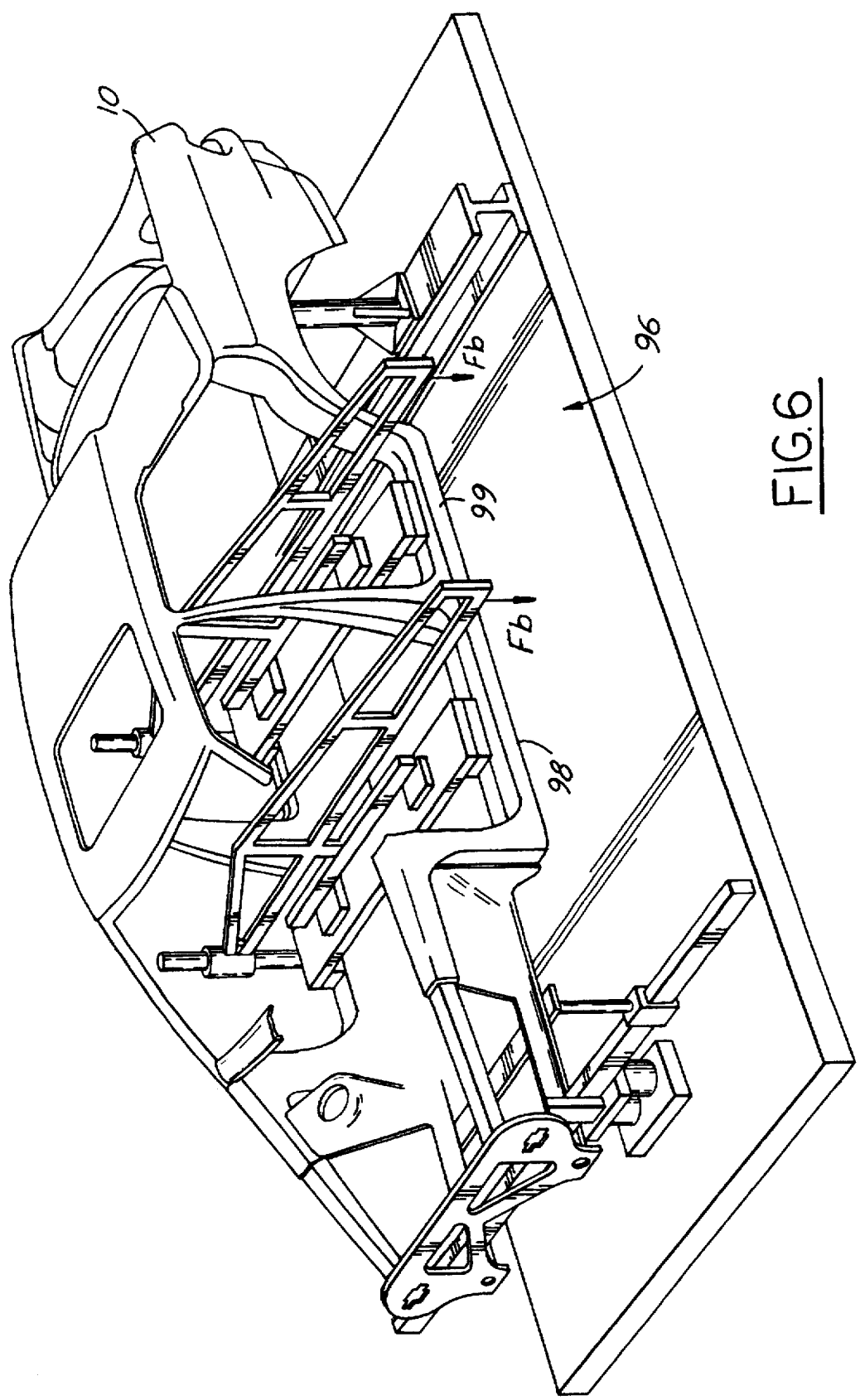
FIG. 6 illustrates a static bending rigidity test.

For the static bending rigidity test, a bending test jig of the type 96 shown in FIG. 6 is utilized in the computer analysis. The body-in-white is theoretically attached to the test jig at the front and rear shock towers and a load is applied equally distributed to the location of the front and rear seats 98 and 99, respectively. The loads are shown by references $F_b$. The vertical deflection is measured on the left and right sides of the BIW relative to the longitudinal members. From this test, the bending displacement and the first derivation of the bending displacement are calculated.

Figure 7:
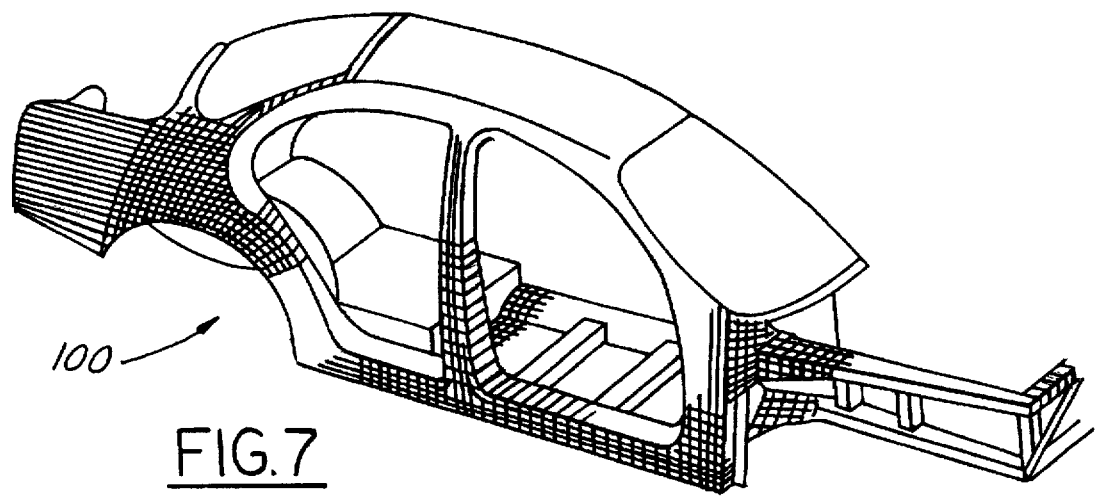
FIG. 7 illustrates a shell model made in accordance with the present invention.

A typical or representative shell model is shown, for example, in FIG. 7 and referenced by the numeral 100. In the shell model, the actual parts of the vehicle are represented and a finite element model is created. As part of the shell model analysis, the optimum gauges (thickness) for all of the materials and parts is theoretically calculated. This is shown by step 88 in FIG. 4. The software has an automated gauge optimization program which calculates and selects the optimum gauge of material for each of the parts.

Of course, throughout this theoretical and computer analysis, it is also necessary to take into account practical limits for the various locations and dimensions of the parts. For example, it is known that steel material for certain parts of a vehicle body should not be less than 0.65 millimeters in thickness. As a result, certain practical limitations and standards are loaded into the computer program and used thereafter as a basis for determining the size, shape, thickness and location for the shell model created.

In the gauge optimization process, the optimum gauge thickness of the materials for the body parts are selected. This provides an optimum minimum gauge and optimum maximum gauge for each part in accordance with the total vehicle body. The gauge is selected in order to maintain the requisite rigidity of the body relative to torsion and bending based on the data secured from the static torsion and bending load cases.

The design sensitivity analysis ("DSA") shown in box 86 in FIG. 4 is utilized to provide a statistical analysis of the strong and weak parts and joints of the theoretical body-in-white. The data secured from the static bending and torsion tests, as well as the crash loads, determine where the weak parts of the vehicle body are and thus which need to be strengthened or redesigned to meet the applicable pre-specified criteria.

Also during the shell model analysis, the global body modes are determined for the theoretical vehicle body. The vibration modes as specified in Hertz (Hz) are established for the various parts of the body, as well as a total body mode for the entire body. In this regard, it is advantageous to have a high frequency for the global body mode. A body which is more rigid and has less mass than other bodies will have a higher global body mode.

Other post-processing and comparisons are made on the theoretical body-in-white. Stress contour plots, displacement plots and modal animations are used to assess structural performance and improve structural design by highlighting problem areas which are then refined in the design. In this regard, the structural efficiency stiffness per unit mass (C/kg) is reviewed. The displacement plots are calculated along the length of the body-in-white from the static torsion and bending analysis. Contour plots are made of stress and strain of the body-in-white. In addition, deformed shape plots are made on the normal mode analysis. These and the other analysis are used to compare the design proposal to the targets, as well as other design proposals which may be in consideration.

As shown in FIG. 2, once a shell model 56 is created, the material gauges and manufacturing processing techniques are selected for that model. The gauges and processing techniques selected will depend on the materials selected for use in the vehicle body. The thicknesses of materials and manufacturing techniques are significantly different for plastic and composite materials than they are for metal materials, and there also are differences depending on whether aluminum or steel is selected as the metal material. For example, with steel materials, the steel for the components could be selected from any of the following: mild steel, IF-steel, high strength steel (CR), high strength steel (HR), bake-hardening steel, dual-phase steel, trip steel, hot-forming steel, and laminated steel.

As for possible processing techniques, several conventional processes are available for manufacturing the parts for the body-in-white if steel materials are utilized. For example, the steel components could be prepared by conventional deep drawing, by improved formability, roll-forming, hydro-forming, tailored blanking, multi-stage stamping, hot stamping, or thin wall vacuum casting. In addition, the processing techniques to be considered include various methods for joining the various metal parts together. These processing techniques include resistance spot welding, arc welding, laser welding, weld bonding, adhesive bondings and mechanical joining. Conventional manufacturing and assembly processes are also available for production of aluminum, composite and plastic parts.

Metal parts made from hydro-forming techniques provide parts with good dimensional control and which are light in weight. The hydro-formed parts have better tolerances and less weight than comparable stamped metal parts. With hydro-formed parts, as opposed to stamped metal parts, the flanges are eliminated around the perimeter or in the joints between the portions of the final parts. Hydro-forming also provides less tooling sets, less assembly costs, greater material efficiency due to less wall thickness reduction and additional work hardening effect. Hydro-formed parts made from DDQ-steel can be utilized for this purpose. The hydro-formed parts can be laser welded or single-side spot welded to the other metal parts in the vehicle body. The hydro-formed parts could also be adhesively bonded or arc welded where appropriate.

Due to their advantages, hydro-formed parts are suitable for use in several places in a vehicle body. Parts made from hydro-forming techniques can include, for example, the two front fender support rails, the two side roof rails, and the pass-through beam which is utilized adjacent the package tray or rear deck. Depending on the styling of the vehicle, other parts could also be hydroformed.

From the design analysis, it is possible to provide certain portions of the vehicle body from laminate or sandwich shear panels. These are areas of the vehicle body which are flat or slightly curved and thus are suitable for use with lightweight metal/plastic laminates or ultra-thin steel sandwiches. Areas on the vehicle body which are suitable for use with these parts include the dash panel inserts, portions of the floor pan, and the spare tire wheel well.

One satisfactory laminate material comprises a polypropylene core sandwiched between two thin outer sheets of steel. It has been shown that a 0.76 mm thick core of polypropylene covered on either side by a 0.12 mm thick DDQ steel panel has the equivalent mechanical properties of performance of a solid sheet of steel which is 0.7 mm thick. The weight of such laminate material is on the order of 2.57 kg/m$^2$. The polypropylene core of the laminate acts as a spacer between the two outer sheets keeping the outer surfaces away from the neutral axis when a bending load is applied to the laminate sheet. For lightweight applications the thickness of the steel skins could be in the range of 0.10 to 0.2 mm, while the core thickness could be as thin as 0.5 mm.

Lightweight laminate or sandwich components have the advantage that they are substantially as formable as some metal materials made from other processes and have densities which are only about one-third of steel with equivalent performance. The laminated or sandwich parts are riveted to adjacent parts, since laminated and sandwich parts are typically not weldable.

Hot stamping or forming is in use today by many car manufacturers. Components made by this process are computer controlled and nearly fully automated. The metal parts are stamped or deep drawn while hot and then cooled quickly which quenches and strengthens the parts. Hot forming results in a lighter component for the same performance (or a stronger component for the same weight). Hot forming techniques are suitable for use in several areas of the body-in-white, such as front shock tower reinforcements, front floor cross members, and door intrusion beams.

Tailor blanking (or tailored weld blanking) produces panels or sheets of combinations of various metal material grades, coatings and/or thicknesses. The pieces of metal material of different thicknesses, grades and the like are welded together and then stamped or otherwise formed into the finished component. The tailor blanking process provides strength where it is needed in the body-in-white, yet allows the reduction of weight or reduction of costs for the remainder of the component or part in other areas. Providing parts in the BIW formed by the tailor blanking process can provide a reduction of significant mass in the vehicle body.

The tailor blanking process is suitable for use in many areas of the body-in-white. These areas include cross members, rails, doors with integrated reinforcements in the hinge area, wheel houses with reinforcement or integrated shock towers, floor pans with integrated tunnel region, multipiece door opening panels and shock towers with integrated reinforcements.

Roll forming is a process which produces a part by passing it through a series of rollers to progressively form the final size and shape of the part. Roll-formed parts are lighter in weight than stamped parts, and eliminate flanges. Roll-formed parts are suitable for use in several areas of the BIW, predominantly in the cross-member for the package tray (rear deck).

The reduction of part weight and the integration of parts also results in a reduction of manufacturing tools and subsequent production steps, both of which lead to improved productivity with lower capital investment. The reduction of parts also simplifies the logistics and increases accuracy of components and subassemblies. The integration of reinforcements, which eliminates lap joints, improves the corrosion behavior of the components. Cost may also be reduced by eliminating the sealer application and compounds required in many overlapped areas. Not only does this mean a smaller work load, but it has advantages in the later recycling process.

An exploded view showing the parts of a light-weight steel vehicle body (BIW) embodiment designed in accordance with the present invention is shown in FIG. 8. The body-in-white 10 includes, for example, right and left fender support rails 110 and 112, respectively, dash panel insert 114, right and left side roof rails 116 and 118, respectively, center front floor pan 120, pass-through beam 122, a package tray cross-member 124, and spare tire wheel well 126. Other components are identified more precisely below when the assembly sequencing and processing is explained.

Figure 9:
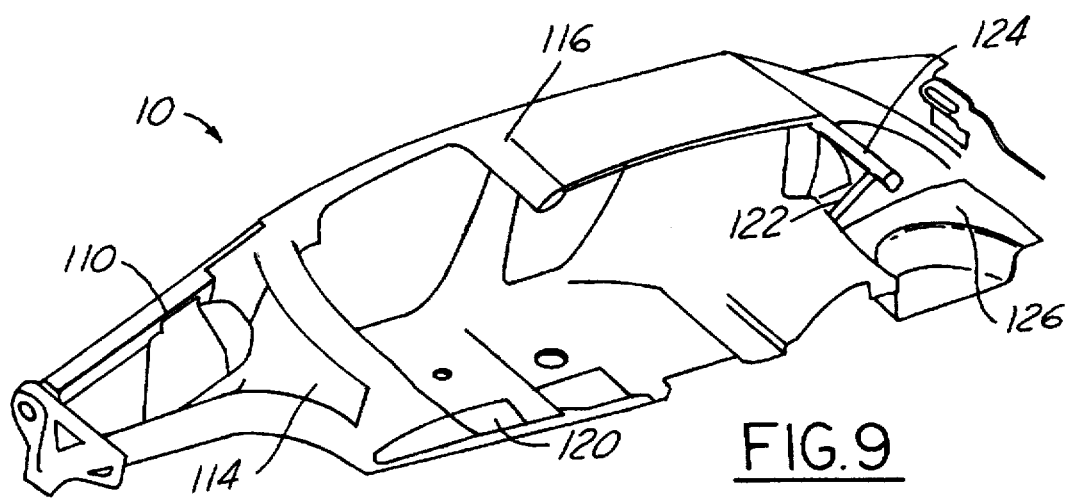
FIG. 9 is a cross-sectional view of a body-in-white made in accordance with the present invention.

A cross-sectional view of a body-in-white 10 made in accordance with the present invention is shown in FIG. 9. The front fender support rail 110, side roof rail 116, and pass-through beam 122, all made by a hydro-forming process, are specifically identified in FIG. 9. In addition, parts made of laminate or sandwich steel material, such as the dash panel insert 114, center front floor pan 120 and spare tire wheel well 126, are shown. The package tray cross-member 124, made by roll-forming techniques is also identified. Many other parts are made by hot forming and tailor blanking while others are made by conventional stamping operations.

Figure 10:
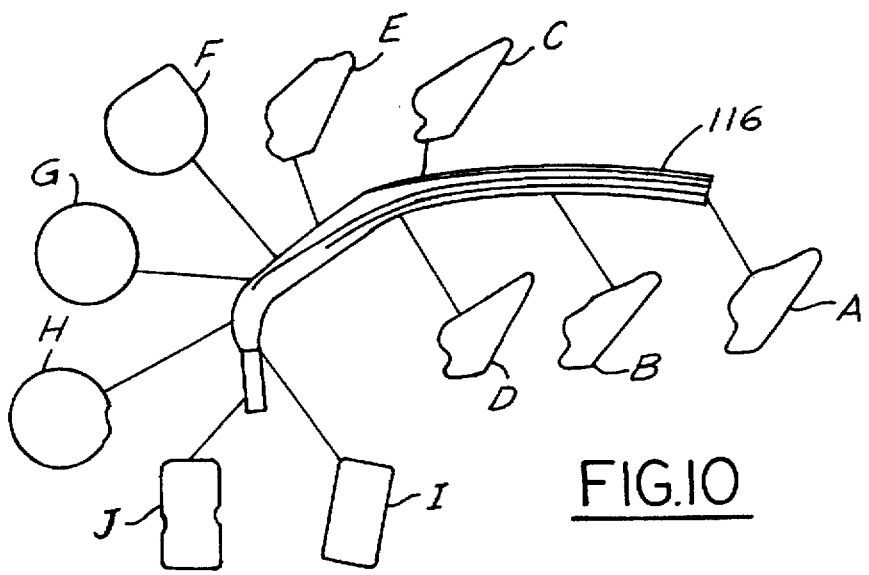
FIG. 10 illustrates a side roof rail for use with the present invention.

Side roof rails of the vehicle body made by a hydro-forming process establish a strong connection between the A-pillars, B-pillars, rear roof headers, corner panels (inner and outer), rear shock towers and rear rails. The shape and size of the side roof rail varies according to its function in several areas. As shown in FIG. 10, the cross-sectional size and shape of the roof rail 116 at various points along its length are shown by cross-sectional diagrams A–J.

The structure of the upper fender support rail 110 (upper apron rail) is shown in FIG. 11. The cross-sectional sizes and shapes at various points along the length of the rail 110 are shown in cross-sectional diagrams A–C in FIG. 11. The advantages of hydro-forming are particularly evident in the upper fender support rail. It is a one-piece part and elongated axially extending flanges can be eliminated. The closed cross-section improves the overall performance of the front end of the vehicle and provides a larger, stronger part.

A comparison of stamped and hydroformed fender support rails is shown in FIGS. 23A and 23B. In FIG. 23A, a conventional stamped fender support rail 110' is shown in combination with the vehicle hood 101', fender 103' and shock tower 105'. The tire clearance 107' is also indicated. FIG. 23S shows the same components, but assembled with a hydroformed front rail 110.

In typical hydro-forming processing techniques, the cross-sectional size is not enlarged more than 10 per cent (10%) over the original size of the tube. However, with the upper rail shown in FIG. 11, it is possible to increase the cross-sectional shape from cross-section A to cross-section C more than 20 per cent (20%).

FIG. 12 illustrates the structure of the pass-through beam 122, while FIG. 13 shows the function and position of the pass-through beam 122 in combination with the package tray cross-member 124, the upper package tray 125, the lower package tray 127, the side roof rail 116, the rear shock tower 131 and the rear rail 133. The pass-through brace 122 provides torsional stiffness for the vehicle body.

The cross-sectional sizes and shapes of the pass-through beam 122 at various portions along its length as formed by the hydro-forming process are shown in diagrams A–C in FIG. 12. In the alternative, beam 122 could also be a bended tubular member.

The pass-through beam 122 is assembled to a mounting plate 121 which in turn is mounted to the rear shock tower 131. As shown in FIG. 13, the combination of the pass-through beam 122, package tray cross-member 124, side roof rail 116, mounting plate 121 and rear shock tower 131 mounted on the rear rail 133 provides a beneficial improvement over known designs. With this vehicle body, the weight and forces imposed on the side roof rail are taken up directly by the shock tower in the rear rail. This configuration provides high rigidity in this area and contributes to the overall torsional rigidity of the vehicle body.

It is also preferable to provide other parts of the body-in-white from material other than stamped material. For example, the two front seat reinforcements 115 and the two front shock tower reinforcements 117 (both shown in FIG. 8), can be made from hot-formed metal, that is metal parts made by a hot-forming process. Hot forming techniques are used to produce these parts because it keeps the weight of the parts to a minimum while at the same time provides higher strength parts for use in these high-stress areas. Hot forming techniques have several advantages and are available from Plannja Hardtech in Sweden. The hot-formed materials have very good formability, better tolerance control (since there is no spring back) and can be tailor blanked. Hot-forming techniques also produce metal parts that have high-tensile strength, reasonable elongation, high fatigue strength, durability, little spring back or distortion, good formability, weldability due to low carbon content, and production feasibility under high volume production conditions.

In the vehicle body, preferably the entire front floor panel 200 is pre-assembled. The front floor panel assembly 200, as shown in FIG. 8, includes right and left front floor outer stamped metal panels 201 and 202, respectively, and center front floor pan 120 made from a laminate material. Also, the front seat reinforcements 115 are positioned on the floor panel. The two outer floor side members are riveted and bonded to the center front floor pan, as are the seat reinforcements. The seat reinforcements are also spot welded to the two front floor outer members 201 and 202. It is also possible to provide other embodiments or versions of a front floor panel assembly with the laminated portion being situated in other areas.

The dash panel insert 114 is preferably made of a laminated material and is screwed (or riveted) and bonded to dash panel member 204 in the front engine compartment of the vehicle. The dash panel insert 114 also has opening 113 for positioning of the steering column mechanism (not shown).

The spare tire wheel well 126 (spare tire tub) is also made from a laminated material and is riveted and bonded to mating parts of the vehicle body, such as lower back panels 205 and 206. These parts are also shown in FIG. 8.

Vehicle bodies made of steel materials in accordance with the present invention have been shown to substantially meet satisfactory structural targets. For example, one designed body-in-white vehicle body made of steel components was shown to have a torsional rigidity on the order of 19000 Nm/deg., a bending rigidity on the order of 12500 N/mm, a mass (excluding glass) or weight of 205 kg and a first mode of vibration of over 50 Hz. These results are well above those known for comparable existing five-passenger, four-door sedans as described above.

Figure 14:
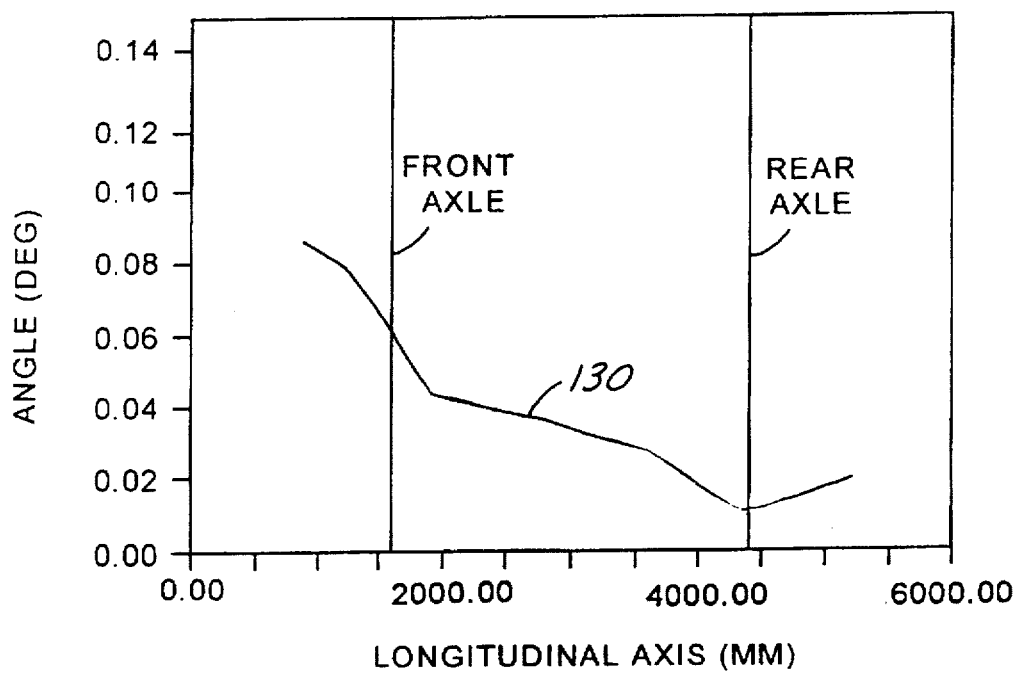
FIG. 14 illustrates a torsional sensitivity displacement plot of torsional angle for a typical vehicle body.
Figure 15:
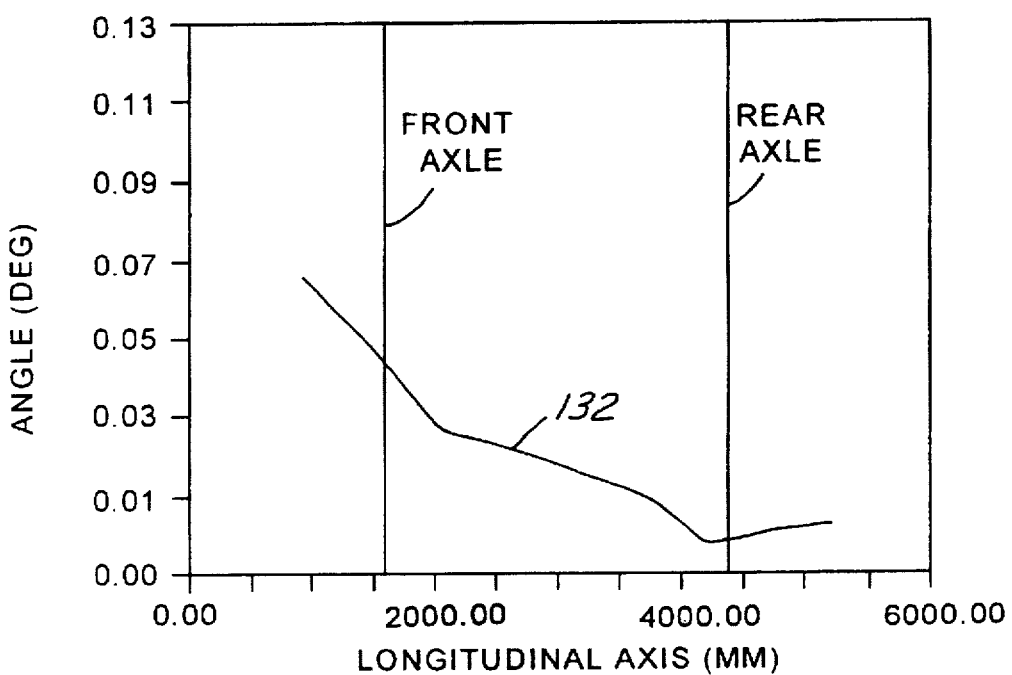
FIG. 15 illustrates a torsional sensitivity displacement plot of torsional angle for a vehicle body made in accordance with the present invention.

The improvement in torsion sensitivity by use of the present invention is shown by a comparison of FIG. 14 with FIG. 15. FIG. 14 illustrates the displacement plot 130 of the torsional sensitivity for a typical vehicle body. The displacement plot for the torsion sensitivity of the torsional angle for a vehicle body designed accordance with the present invention is shown in FIG. 15. A comparison of FIGS. 14 and 15 shows that there is less discontinuity of the torsional angle at the front and rear rails where they are joined to the rocker panels with the vehicle designed and produced in accordance with the present invention. This indicates that there is better load transfer and less stress at those joints with the present invention.

Figure 16:
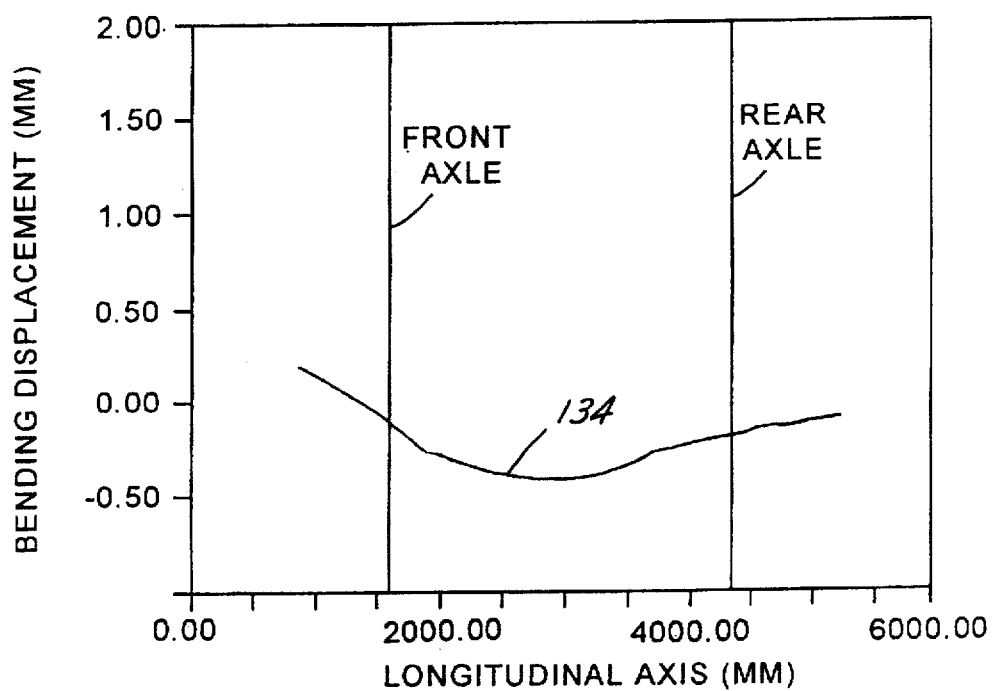
FIG. 16 illustrates a bending sensitivity displacement plot of bending displacement for a typical vehicle body.
Figure 17:
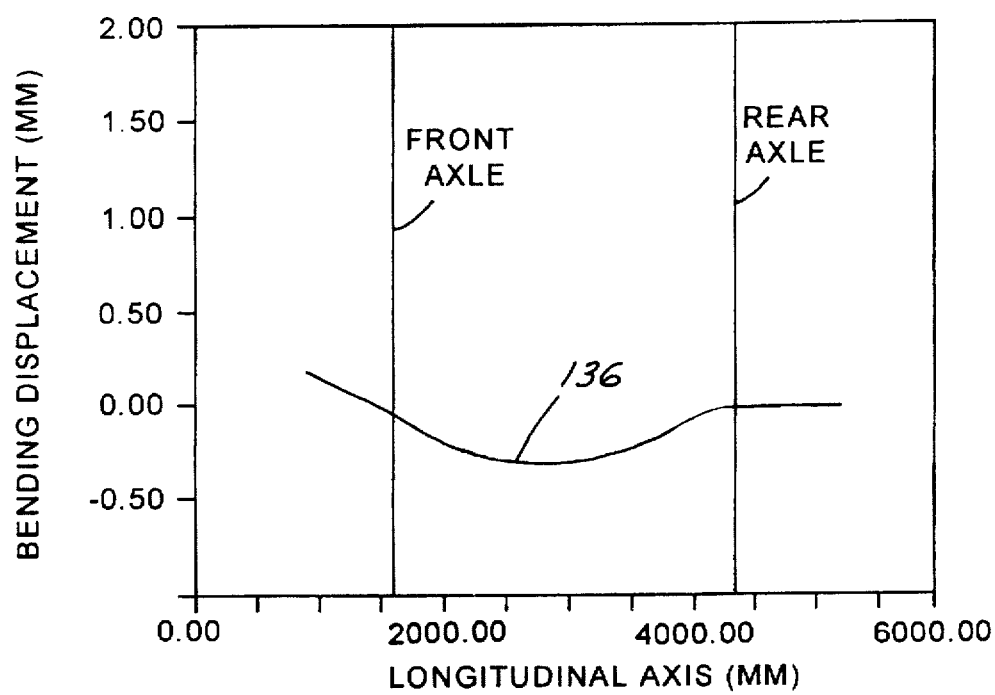
FIG. 17 illustrates a bending sensitivity displacement plot of bending displacement for a vehicle body made in accordance with the present invention.

The advantages of the present invention are also evident from a review of the bending displacement analysis. This is shown in FIGS. 16 and 17. FIG. 16 shows a representative bending sensitivity displacement plot 134 of a vehicle body made in accordance with conventional design concepts. As shown in FIG. 17, the bending sensitivity displacement plot 136 of a vehicle body design made in accordance with the present invention contains much smoother curves.

An enlarged view of the preferred joint structure 138 between the A-pillar member 24, dash cowl member 26 and front fender upper support rail member 42 is shown in FIG. 18. Cross-sectional views through the joint structure 138 are shown in FIGS. 19 and 20. A better stress distribution over a wider area, an increase in rigidity, and an improvement of resistance in the bending loads are achieved by the unique joint structure 138. The dash cowl member 26 passes entirely through the A-pillar member 24 and front fender rail member 42 to the outside of the vehicle body 10, leaving a hole or opening 140. This is in contrast to existing vehicle bodies in which the A-pillar member and door pillar member essentially comprise a solid integrated member and the dash cowl member is joined or welded to the inside surface thereof. The opening 140 also provides access to allow welding of the members 24 and 26 along their end flanges 25 and 27, as shown in FIGS. 19 and 20.

Figure 21:
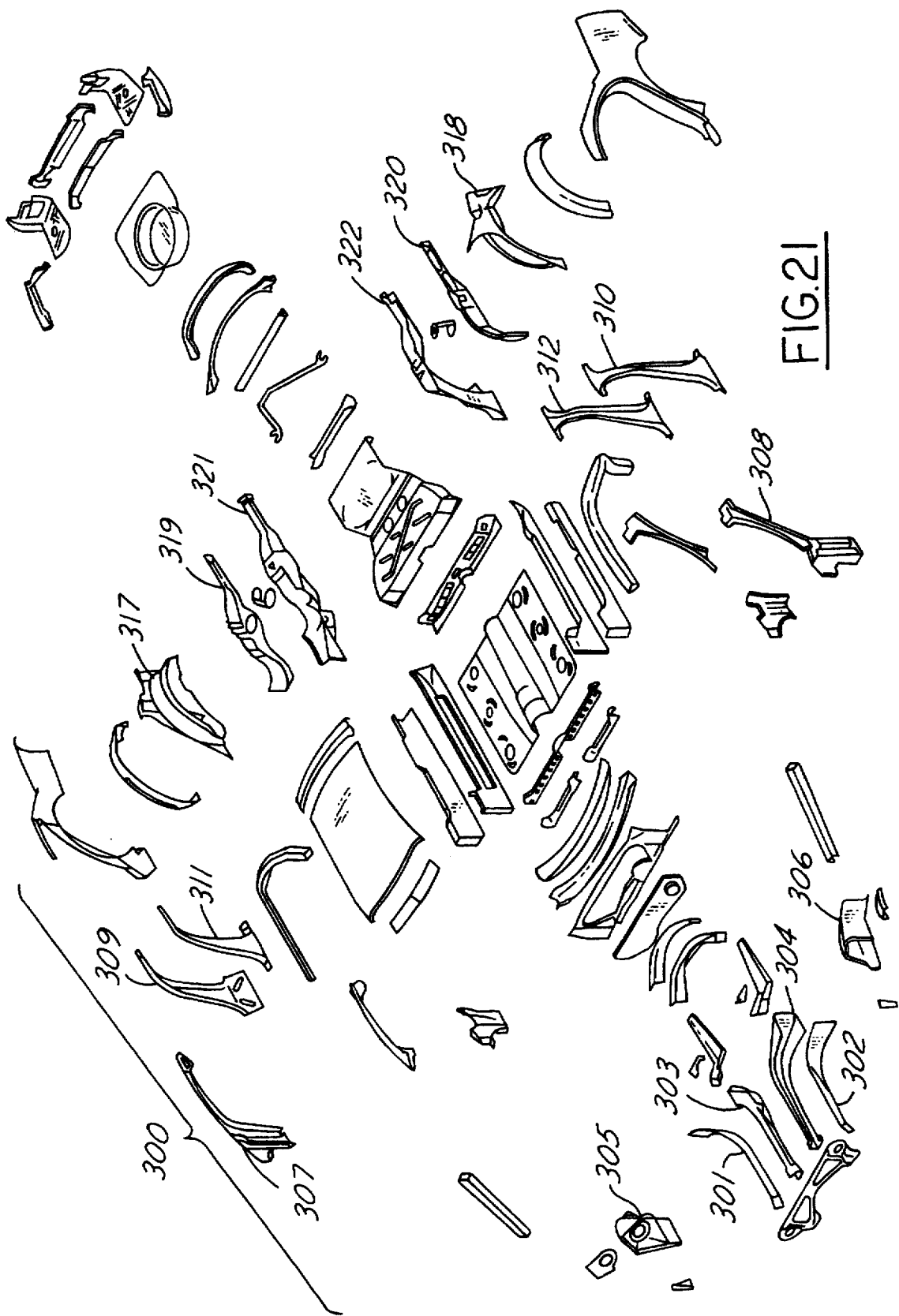
FIG. 21 is an exploded view of another embodiment of a body-in-white developed in accordance with the present invention.

In accordance with the present invention, it is preferred to provide a number of the parts for the vehicle body (BIW) made from a tailored blanking process. For one embodiment of the invention, these parts are shown in FIG. 21 and the BIW is generally referred to by the reference numeral 300. Tailor blanking parts have numerous advantages, since they eliminate reinforcements, consolidate separate parts, and require less sub-assembly welding. The tailor blanked parts may include, for example, the right and left front outer rail members 301 and 302, respectively, the right and left inner front rail members 303 and 304, respectively, the right and left front wheel house members 305 and 306, respectively, the right and left A-pillar outer panel members 307 and 308, respectively, the B-pillar inner and outer right and left members 309, 310, 311 and 312, the right and left inner and outer rocker panel members 313, 314, 315 and 316, the right and left inner quarter panel members 317 and 318, respectively, and the right and left inner and outer rear rail members 319, 320, 321 and 322. Tailored blanking also provides reduction of deep drawing tools, savings in assembly costs, less tolerances for sub-assemblies, better fatigue strength of welded areas in contrast with spot welding, and savings of sealing material, as well as greater weight savings potential.

Some of the remaining components and members of the body-in-white 300 shown in FIG. 21 are preferably made from the materials and with the processes described above with reference to FIG. 8, and the remainder are made from conventional stamped steel materials.

It was found from the analysis described above, that vehicle bodies made from steel or laminate materials and utilizing a combination of unibody and hydroform intensive design concepts met satisfactory structural and functional performance targets. Vehicle bodies made entirely from space frame, unibody, hydroform intensive or full frame design concepts were insufficient to meet the appropriate goals. A vehicle body basically using a unibody approach, but with numerous components made from hydroformed, laminate, roll-forming, tailor blanking, and hot-forming as described above, when combined together met the performance targets. The resultant vehicle body reduced the weight on the order of 20% or more over comparable steel bodies designed by conventional means.

Also, as stated above, a reduction of the weight of the body-in-white should lead to a further significant reduction in overall weight of the finished vehicle. With a lighter vehicle body frame, numerous other components can be made with less mass or weight, such as the engine, brakes, suspension, wheels, transmission, and the like. Reductions in weight not only lead to better fuel economy and emissions control, but also reduce the cost of manufacture and the resultant retail cost to consumers.

The body-in-white is designed to meet structural performance targets as mentioned above and it is also designed to meet certain functional performance targets. These functional performance targets include the overall package, crash analysis, and assembly for mass production. In this regard, mass production is assumed to mean the production of more than 100,000 vehicle bodies on an annual basis.

The functional performance targets with respect to the package, include the wheel base, interior room, weight and the like as described above. These considerations are also taken into account during the structural performance design aspects.

For the crash analysis, selected tests were performed to verify that the vehicle body as designed met the targets of performance and functionality. In particular, the analytical crash testing involved a simulated front crash test, rear crash test, roof crush test, and side impact test. It is also possible to simulate other crash tests, such as off-center crash tests, and incorporate the resulting data into the analysis. The crash testing was accomplished by computer simulation using Cray computers and Livermore LS DYNA3D software, although other suitable software and hardware could be utilized. A high level of detail of the surfaces, welding and mounting locations was imputed in order to provide the best possible resolution required to describe the crash events. The LS DYNA3D model utilized over 600,000 degrees of freedom and provided a satisfactory computer structural analysis.

The Livermore software LS DYNA3D is a non-linear, explicit analysis software. The software reviews the stress and strains in all parts of the vehicle body in both elastic and non-elastic areas. A supercomputer was used to analyze the results of the analysis. In particular, Cray EL 98 and Cray C-90 supercomputers were utilized. The analysis used 250 megabytes of RAM and produced 10 gigabytes of data output.

In the crash testing, certain assessment parameters were established. It was desired that a uniform load be created during the crash tests and that the load be carried throughout the vehicle, that is throughout every weld, component and the like. The crash pulse was set to be 0.1 seconds to a full stop. A progressive crush of the vehicle was desired with all parts being crushed in sequence from the crash test. In stack-up, the rigid bodies in the vehicle were designed to limit the crush and provide component integrity. The door openings were designed so that they would not be deformed sufficiently, but would still allow doors to be opened after a crash impact. The size and shape of the passenger compartment, as well as the toe pan displacement, were also designed to remain substantially intact throughout the crash analysis. In general, the vehicle body was designed for occupant protection so that the occupants could be removed from the crushed vehicle without too much difficulty after the crash.

As a result of the crash tests, certain components of the vehicle body design were modified or strengthened. In this regard, the rocker and joint members were modified slightly in order to obtain a smooth, progressive crushing of the vehicle. Reinforcements were also added where necessary. An annular groove 240 was also added to the front upper rail members 42, as shown in FIG. 18, in order to direct the buckling of the rail member in the crash tests in a progressive manner with the other components.

The front crash analysis was set up to duplicate a 35 mile per hour (55 km/hr) test designed by the National Highway and Traffic Safety Association. In the front crash test, the crash pulse, peak loads, and overall crush space and deformation were analyzed.

The roof crush analysis was based on United States Federal Motor Vehicle Safety Standard FMVSS 216. This requirement is designed to protect the occupants in the event of a roll-over accident. The roof deformation was limited to five inches (127 mm) of crush and the roof structure was designed to support 5,000 pounds. Under the federal standards, the roof structure support must support 1.5 times the vehicle weight or 5,000 pounds, whichever is less. The design requirement in the test for roof crush in accordance with the present invention was set at the upper limit of 5,000 pounds peak crush load. This allows future platforms to vary the total mass of the vehicle and still meet the United States federal roof crush requirement. In the roof crush test, the assessment parameters considered were peak loads and force versus displacement.

For the rear crash tests, the analysis was based on United States Rear Moving Barrier Test FMVSS 301. The test specifically addresses fuel system integrity during a rear impact. The structural integrity of the vehicle, as well as the deformation of the passenger compartment volume, were addressed in this crash test. The assessment parameters for the rear crash analysis were peak loads, overall crush space and deformation, and fuel system integrity.

The conditions for the side impact crash analysis were based on the European Side Moving Barrier Test. The European test addresses injury criterion based on displacement data gathered from EUROSID side impact crash dummies. Assessment parameters reviewed from the side impact analysis were the overall post-crash structural integrity and possible passenger compartment intrusion.

As indicated in FIG. 2, after the crash test model 66 is created, it is analyzed by computer simulation at step 72. If the crash test requirements are met, as shown in decision box 76, then a final structural analysis 74 is carried out. If the crash requirements are not met, then the crash model design is modified and redesigned, as shown by box 78.

In this regard, in the model designed from steel materials, as described above, several changes were made as a result of the crash analysis. These changes include removal of a flange in the front skirt area and adding it at a different location. The package for the upper component was also reduced in size and optimized for better assembly. The lower back panel side component was modified slightly in order to better compensate for the tolerances throughout the length of the car. Some of the front floor reinforcements for the front seat were also deleted. (Compare FIG. 35 with FIG. 21.) Further, the door frame at the B-pillar member was redesigned; four parts were combined into a one-piece body side outer member which provided better tolerance control and deleted several welding steps and processing. In addition, the lower back panel reinforcement was extended under the rear taillights. This reduced weight, but kept the necessary strength and rigidity.

Three kinds of steel materials were used in the preferred vehicle body, including mild steel, high strength steel, and laminated steel. Tailor blanking was utilized in several portions of the vehicle body in order to meet the crash standards. Several portions of the components were upgraded to make them stronger, while other portions were downgraded to reduce mass and weight where possible.

After several reiterations and modifications of the crash model, the final structural analysis as shown in box 74 was completed and the vehicle body was deemed to meet the structural performance targets shown in box 80.

Other functional requirements for the vehicle body include manufacturing processing and assembly techniques. In this regard, as indicated above, laser welding techniques were utilized for the hydroformed components. Since hydroformed components are only accessible for welding from one side, laser welding is preferably utilized to attach the hydroformed components to adjacent components of the vehicle body. One sided spot welding could also be utilized.

The laser welding can be conducted with a Nd:YAG laser, although other suitable laser welding equipment can be utilized. There are several models and suppliers of YAG lasers on the market, such as Rofin Sinar in Hamburg, Germany.

In order to improve the bending rigidity of the vehicle body and thus allow reduction of mass in other parts and components, it is preferred that the body side outer panels be weld bonded to the body structure. In weld bonding, a structural adhesive is applied to the weld flanges prior to installation and spot welding in the framing assembly sequence. The preferred areas for weld bonding and application of adhesive are shown in FIG. 22 and indicated by the reference numeral 142. Gaps 144 and 146 along the upper roof rail as shown in FIG. 22 are provided in order to effectively laser weld the side panels to the hydroform roof rail components 116 and 118.

It was found that weld bonding improves the durability for the vehicle body, increases the torsional rigidity over 1% and increases the bending rigidity by approximately 8%.

In the design of the vehicle body, it is also necessary to take into account the final assembly of the various parts and components. For mass produced vehicles in particular, it is necessary to have an assembly process and sequence which is susceptible for mass production.

The preferred assembly sequence of the various parts and components in the vehicle body are shown in FIGS. 24–34. The overall assembly sequence is an "inside out" sequence. In general, the vehicle body consists of a front structure assembly; front floor assembly, and rear floor assembly being joined together to form an underbody assembly. The underbody assembly is then joined with the cowl member, roof header members, package tray member and body side inner assembly in the framing operation. Finally, the exterior panels are added to form the completed body-in-white structure.

The assembly structure was designed in part to reduce the weight of the vehicle. This is shown in particular by the materials and manufacturing techniques used to form the various parts and components. For example, a hydroformed component is used to form the front fender support rail 110. This increases the section area with a resulting down-gauging of the tubular wall thickness. A comparison of hydroformed fender support rails with stamped fender support rails is shown in FIGS. 23A and 23B, and described above.

Since the fender rail support is installed early in the front structure assembly, the control of the front fender member to hood member margin can be included in the design of the cowl and radiator reinforcement. The radiator can be installed during engine decking thereby allowing all hose and tube installations to be completed off-line. Thus, a lower radiator reinforcement is unnecessary in the vehicle's body design. Several other radiator support arrangements could be configured without significant weight gain as required for variations in engine package, cooling requirements or styling features.

Assembly of the front floor, rear floor and underbody is generally of a conventional nature. In the framing stage, the exterior panels are excluded. In addition, the numerous large weld gun access holes typically found in conventional stamped unibody vehicle body designs are not necessary with the present invention. This results in numerous weight gains, as well as increased structural rigidity. In this regard, large holes for weld gun clearances adjacent to joints is undesirable, especially in the cowl area, A-pillar to rocker panel, and package tray to C-pillar areas. By excluding the exterior panels, clearance can be provided to all welds in the welding areas with access holes. The installation of the roof member and body side outer panels also does not require any weld access holes.

Also, the hydroformed members 116 and 118 forming the two side roof rails carry the upper body loads directly to the rear rail members on top of the rear shock towers. This eliminates a re-strike operation to afford fore/aft adjustment of the body side inner assembly as is conventionally or typically done in the manufacture of vehicle bodies.

The preferred assembly process for assembly of the preferred steel body-in-white in accordance with the present invention is described below. Also, changes in the assembly sequence and operations can be made for specific customer requirements with little or no effect on the mass or weight of the vehicle body.

Figure 24:
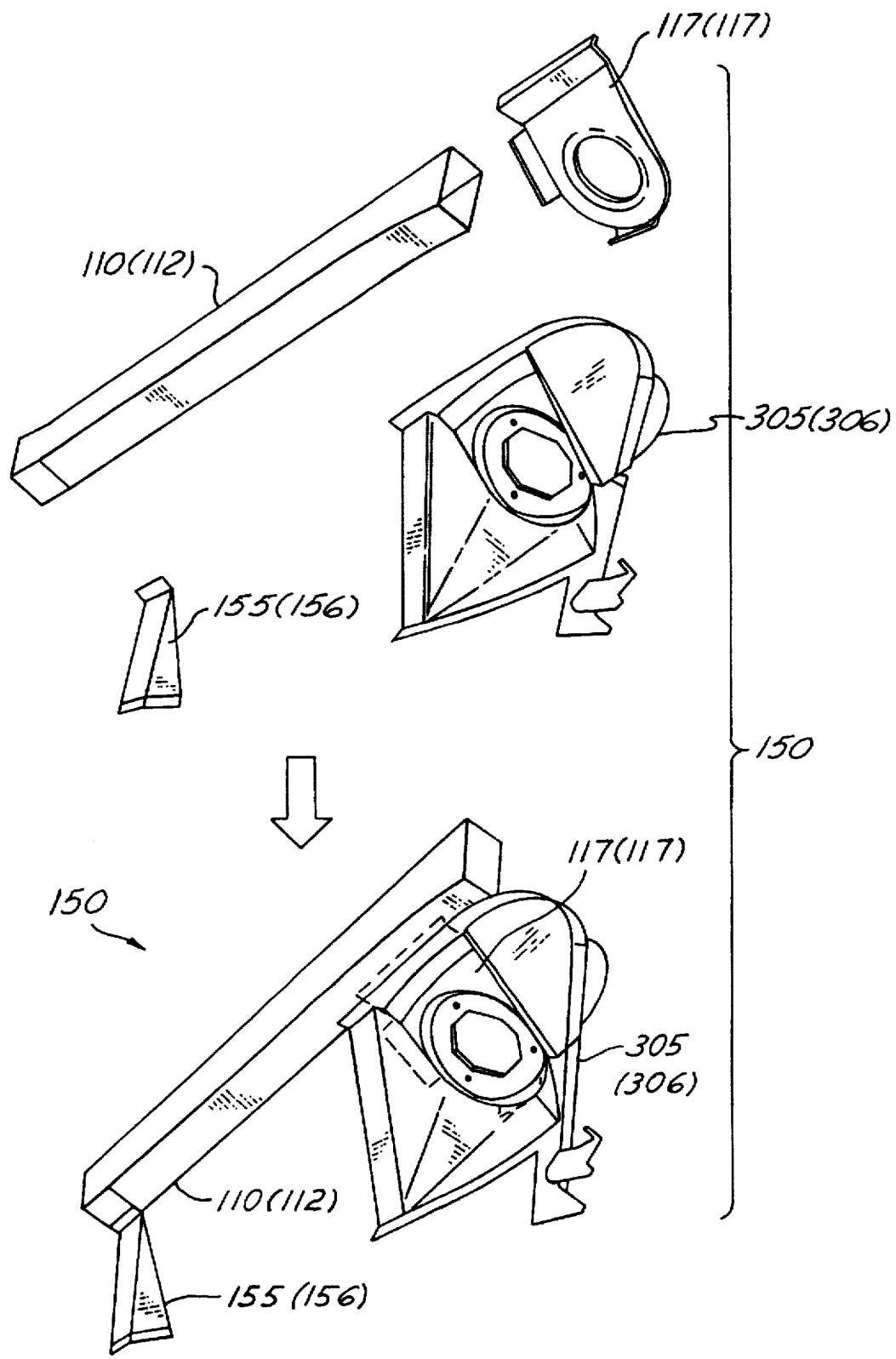
FIGS. 24-34 illustrate the steps for assembly of the present inventive body-in-white.

In the assembly sequence, the two front skirt assemblies 150, as shown in FIG. 24, are first constructed. The front fender supports 110 and 112, the front shock tower reinforcements 117, 117, the panel skirt 305, 305, and the panel radiator side supports 155, 156 are welded together to form the two (right and left) skirt assemblies 150. The hydroformed fender support rails 110 and 112 are laser welded to the panel skirts and radiator side supports. The front shock towers are spot welded to the skirts and laser welded to the fender support rails to form the two front skirt assemblies.

Figure 25:
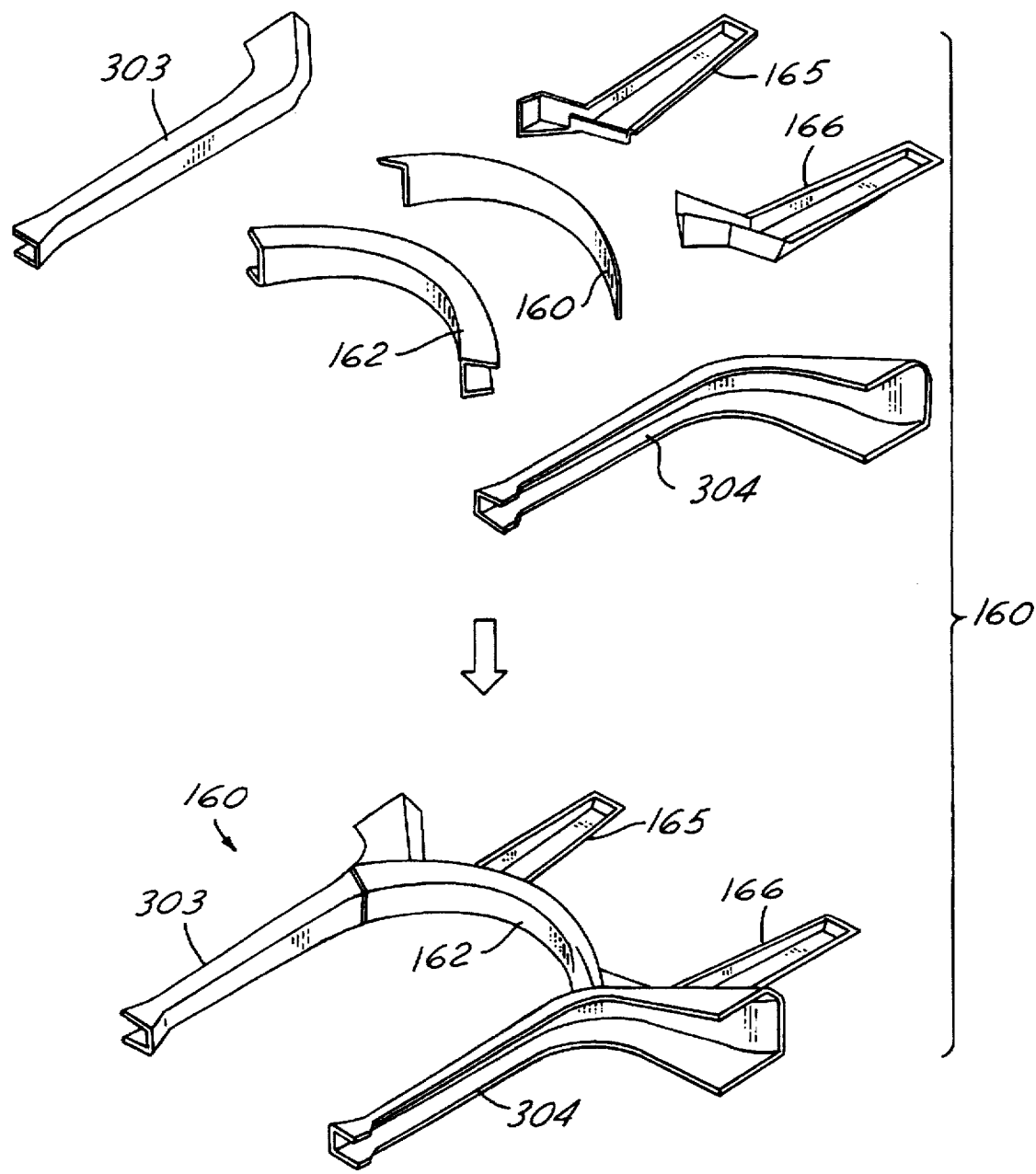

Simultaneously, the front rail assembly 160 is constructed, as shown in FIG. 25. The rear dash member 161 is welded to the front dash member 162. To this subassembly, the front inner rail members 303 and 304 and front rail extension members 165 and 166 are spot welded to create the final front rail assembly 160.

Figure 26:
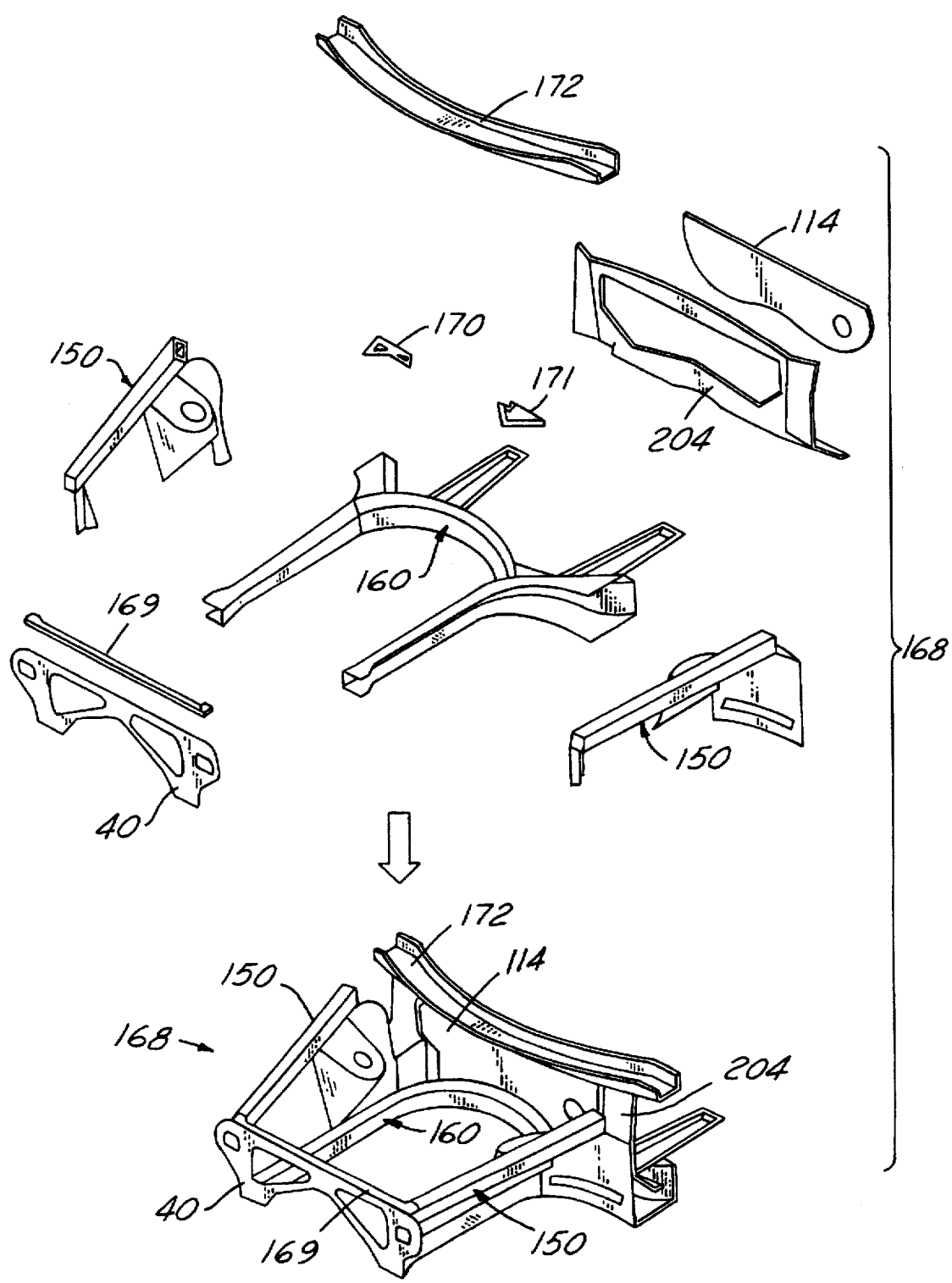

Thereafter, the front structure assembly 168 is constructed, as shown in FIG. 26. The two front skirt assemblies 150, upper front radiator support reinforcement 169 and front rail extension upper members 170 and 171 are loaded onto the front rail assembly 160 and spot welded. The dash panel insert 114 is preassembled to the dash panel member 204 and spot welded. The lower dash cowl member 172 is spot welded to the dash panel 204 forming the final front structure assembly 168.

Figure 27:
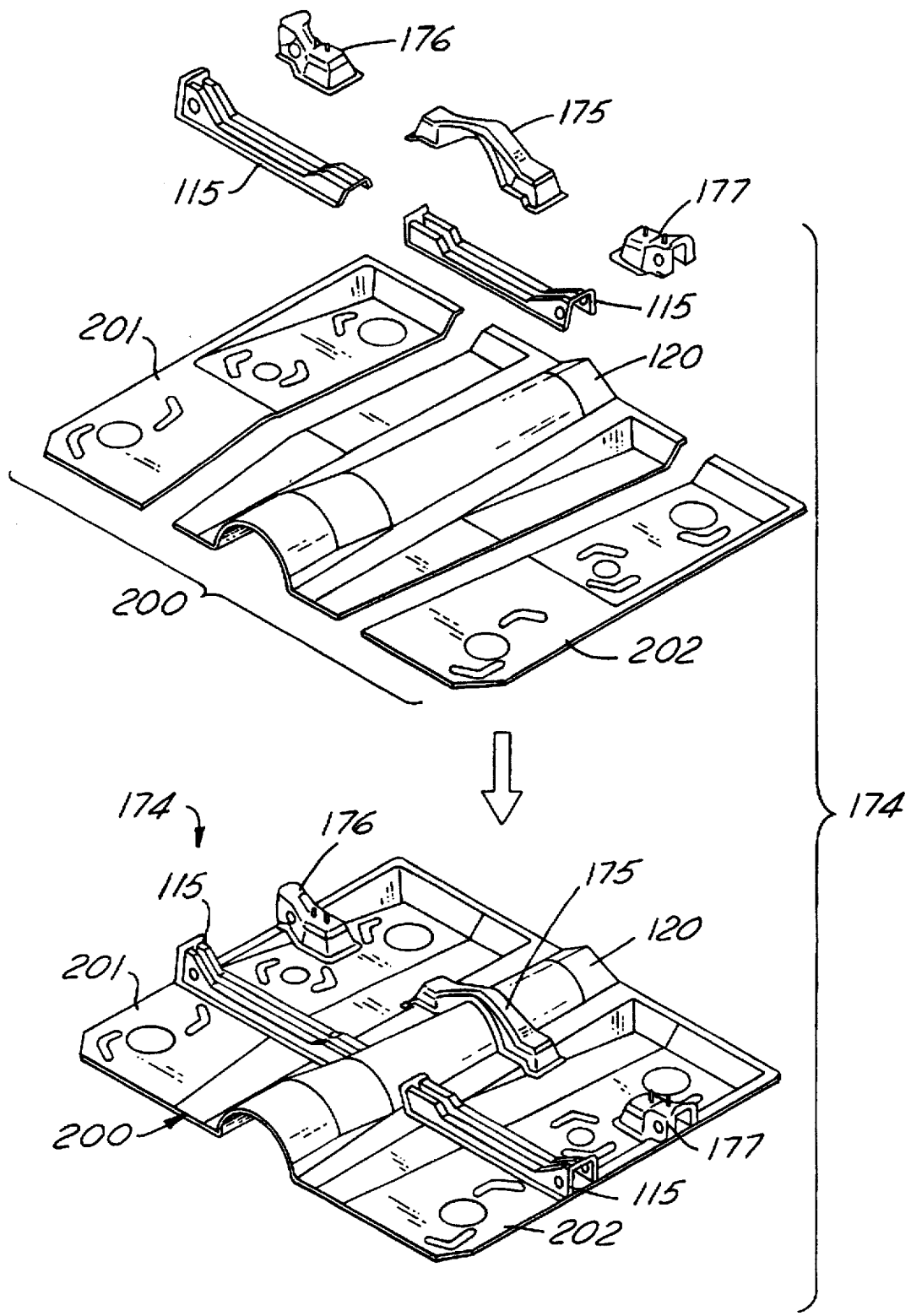

At an adjacent site in the assembly facility, the front floor assembly 174 is completed, as shown in FIG. 27. The front floor seat center member 175, the two front outboard floor seat members 176 and 177, and the front floor support members 115 and 115 are spot welded, riveted and bonded to the pre-assembled floor pan assembly 200. The assembly 200 consists of the riveted and bonded laminated front floor pan center 120 and the two front floor pan outer members 201 and 202.

Figure 28:
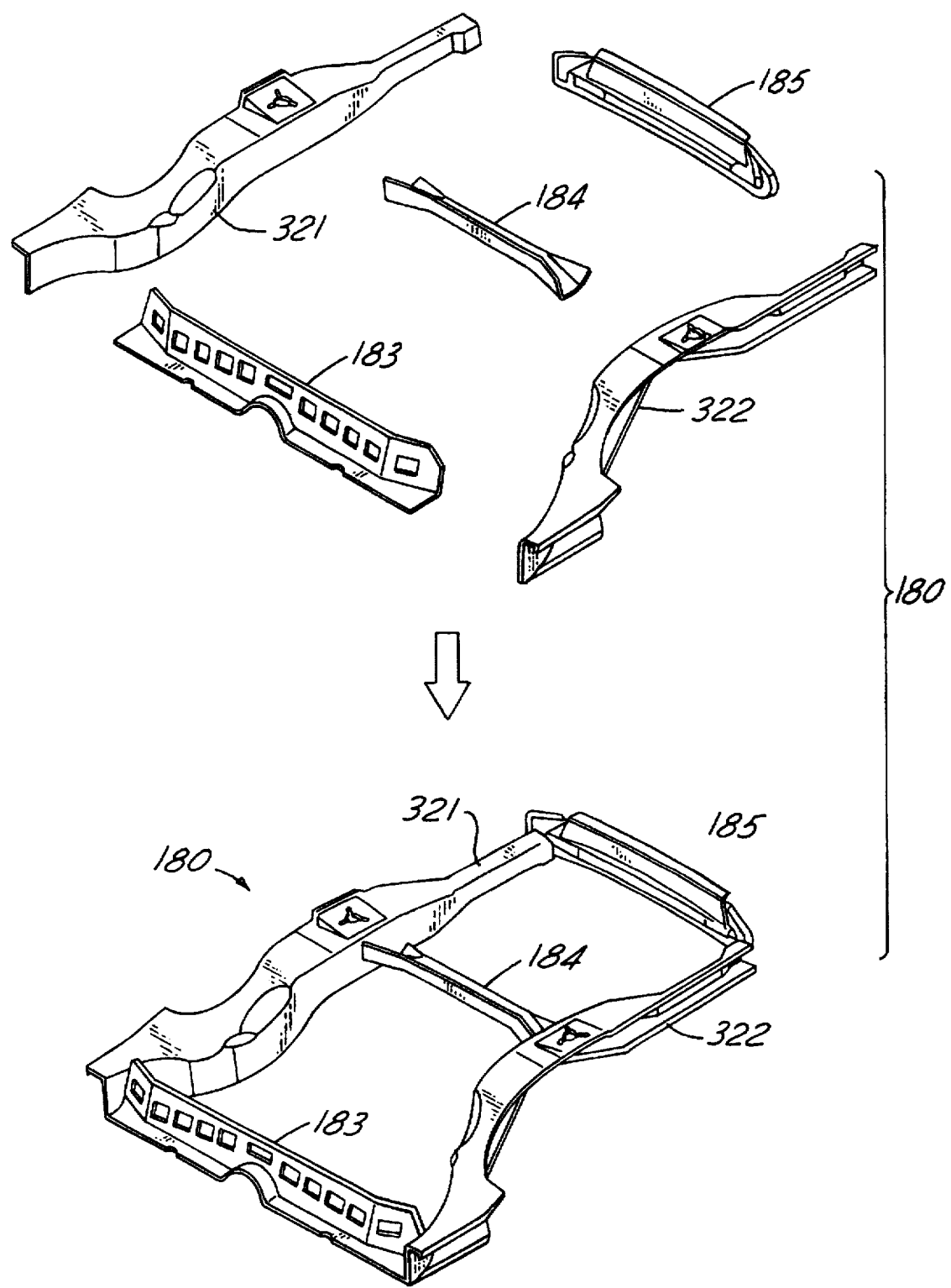

Also, simultaneously or in sequence, the rear ladder assembly 180 can be completed, as shown in FIG. 28. The rear rail inner members 321 and 322 are spot welded to the rear kickup member 183, rear suspension member 184, and lower back panel reinforcement 185.

Figure 29:
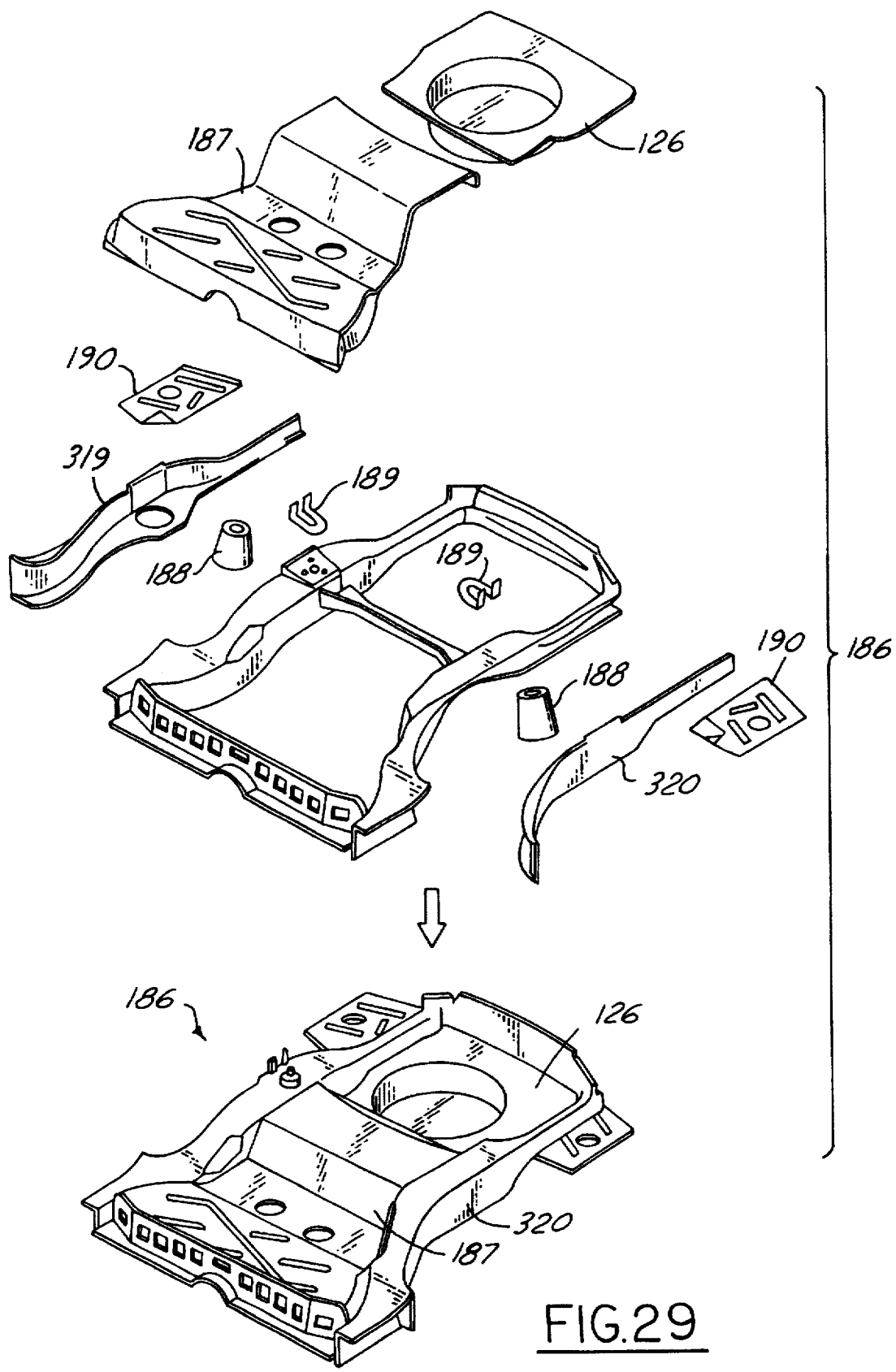

Thereafter, the rear floor pan assembly 186 is constructed, as shown in FIG. 29. The side rear rail members 319 and 320 and rear floor pan member 187 are loaded to the rear ladder assembly 180 (from FIG. 28) and spot welded. The laminated spare tire tub 126 is loaded, riveted and bonded to the rear floor assembly. The off-line spot welded assembly of the rear shock tower reinforcements 188, 188 and brackets 189, 189 are added along with the rear floor extension members 190, 190 and spot welded.

Figure 30:
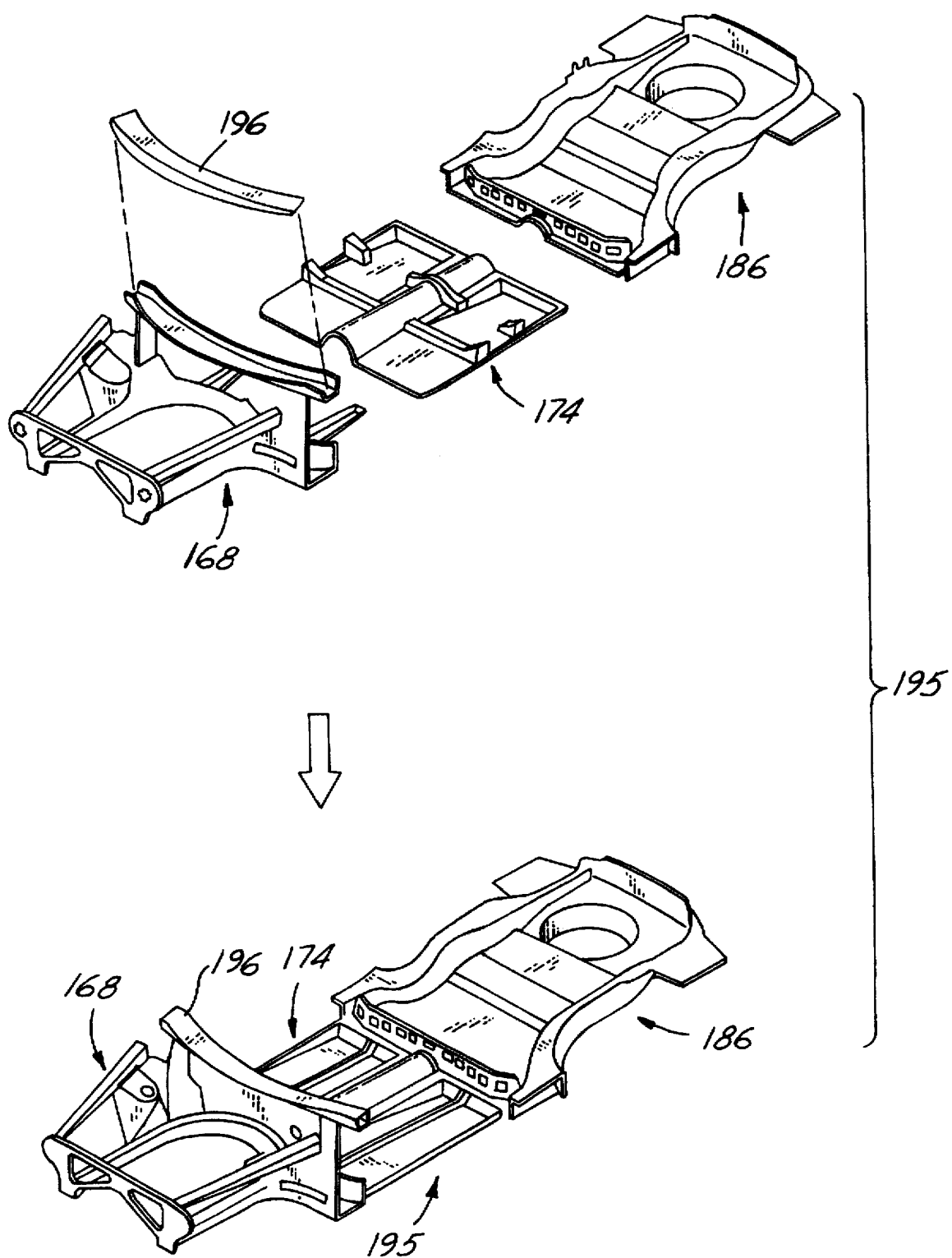

Next, the underbody assembly 195 is completed. This is shown in FIG. 30. The front structure assembly 168, as shown in FIG. 26, the front floor assembly 174 as shown in FIG. 27, and the rear floor pan assembly 186, as shown in FIG. 29, are assembled together along with upper dash cowl member 196 to form the underbody assembly 195.

Figure 31:
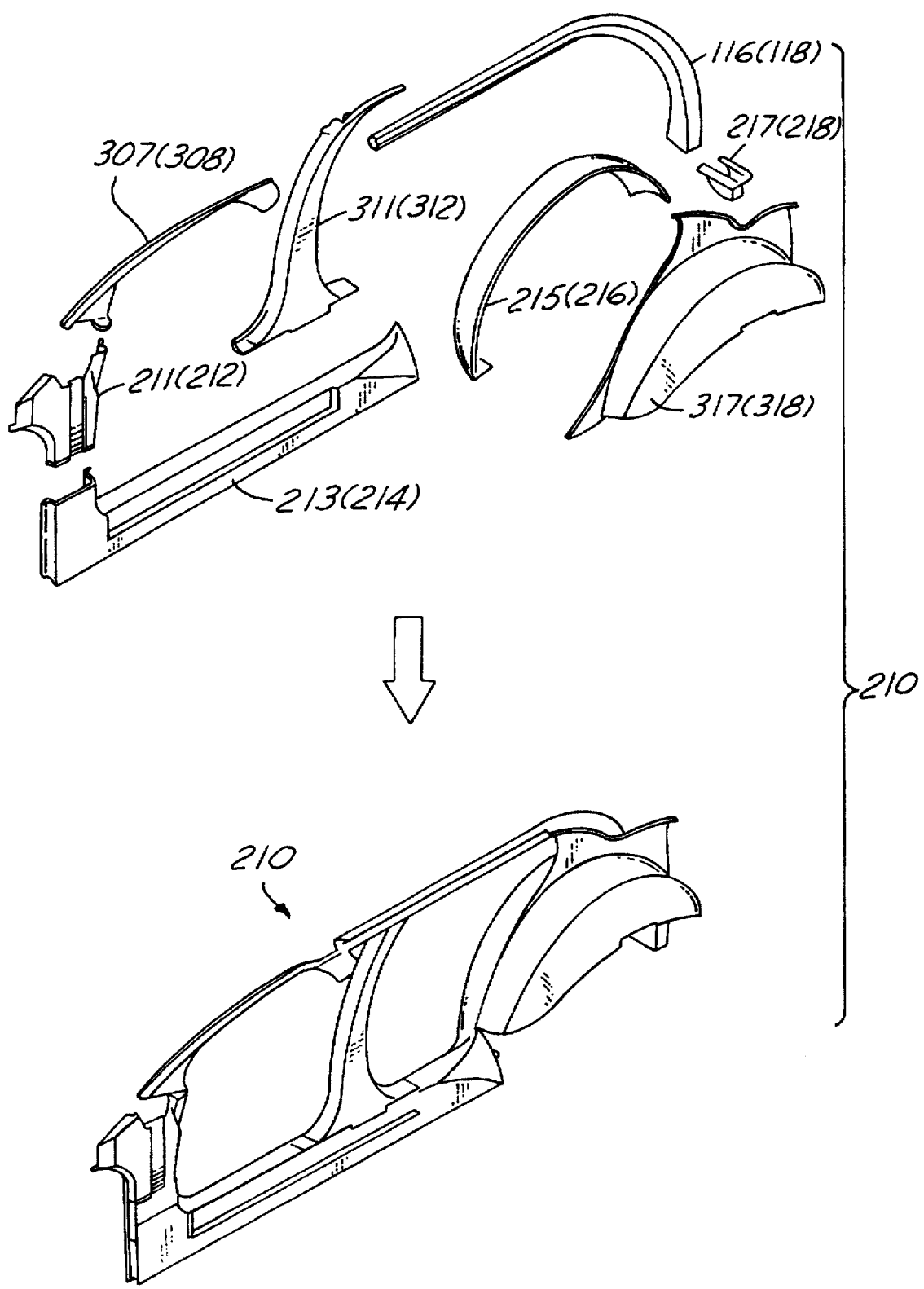

The two (right and left) body side inner assemblies 210 are completed, as shown in FIG. 31. The following components are loaded into a body side inner assembly fixture (right and left) and spot welded together: A-pillar inner lower members 211 (212), A-pillar inner upper members 307 (308), rocker panels 213 (214), B-pillar inner members 311 (312), side roof rail members 116 (118), outer wheel house panel members 215 (216), package tray support members 217 (218), and inner quarter panel members 317 (318). Additional laser welding is carried out to complete the joining of the hydroformed side roof rails 116 and 118 to the other components.

Figure 32:
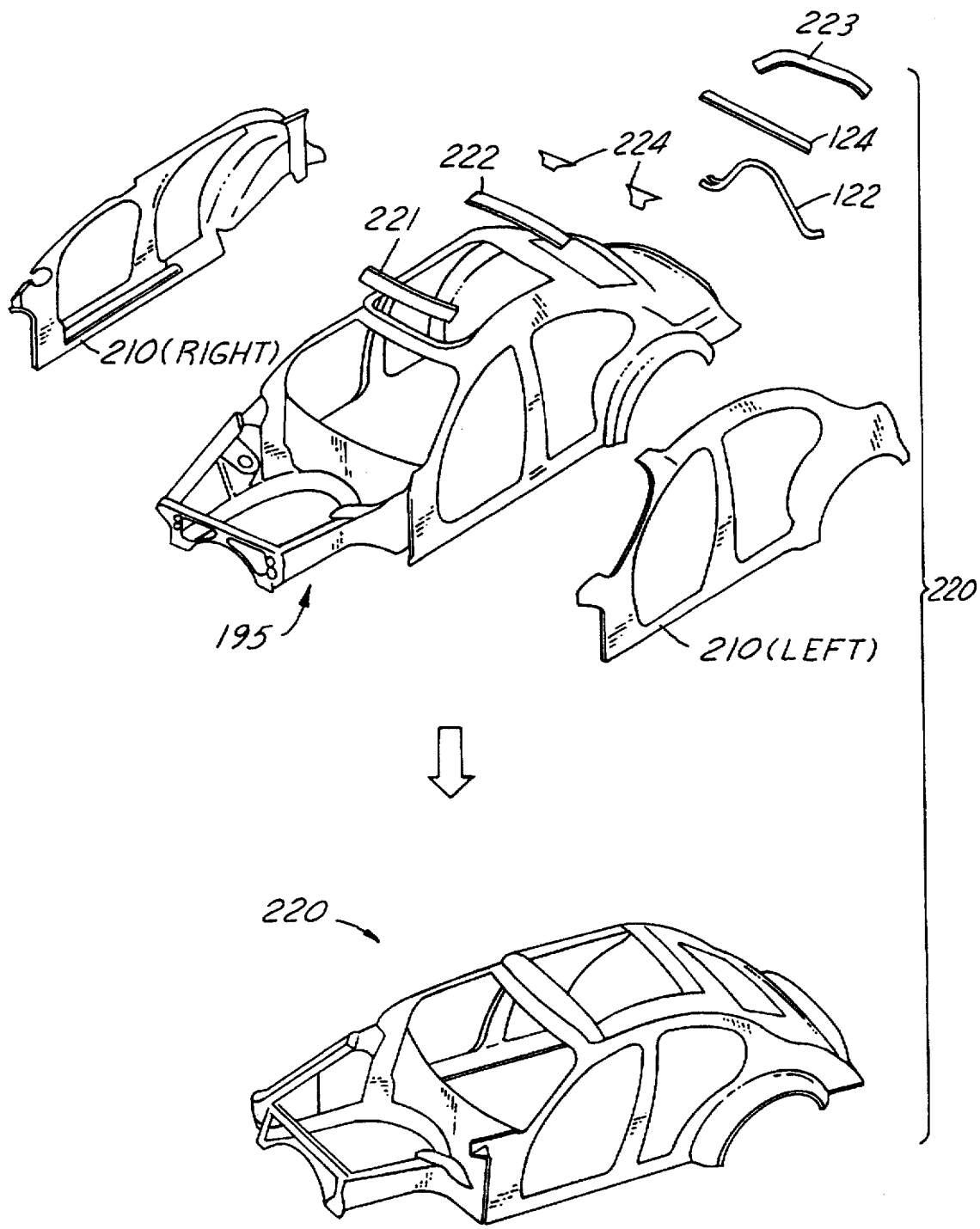

In the next step, as shown in FIG. 32, the body side inner assemblies 210 (right and left), as shown in FIG. 31, are joined in a framing fixture to the underbody assembly 195, as shown in FIG. 30, to form the framing assembly 220. In addition, the front and rear headers 221, 222, package tray cross member 124, package tray support members 224 and 224, pass through beam 122 and package tray reinforcing member 223 are assembled at the same time. After spot welding is performed, the hydroformed side roof rails 116, 118 are laser welded to complete the assembly.

Figure 33:
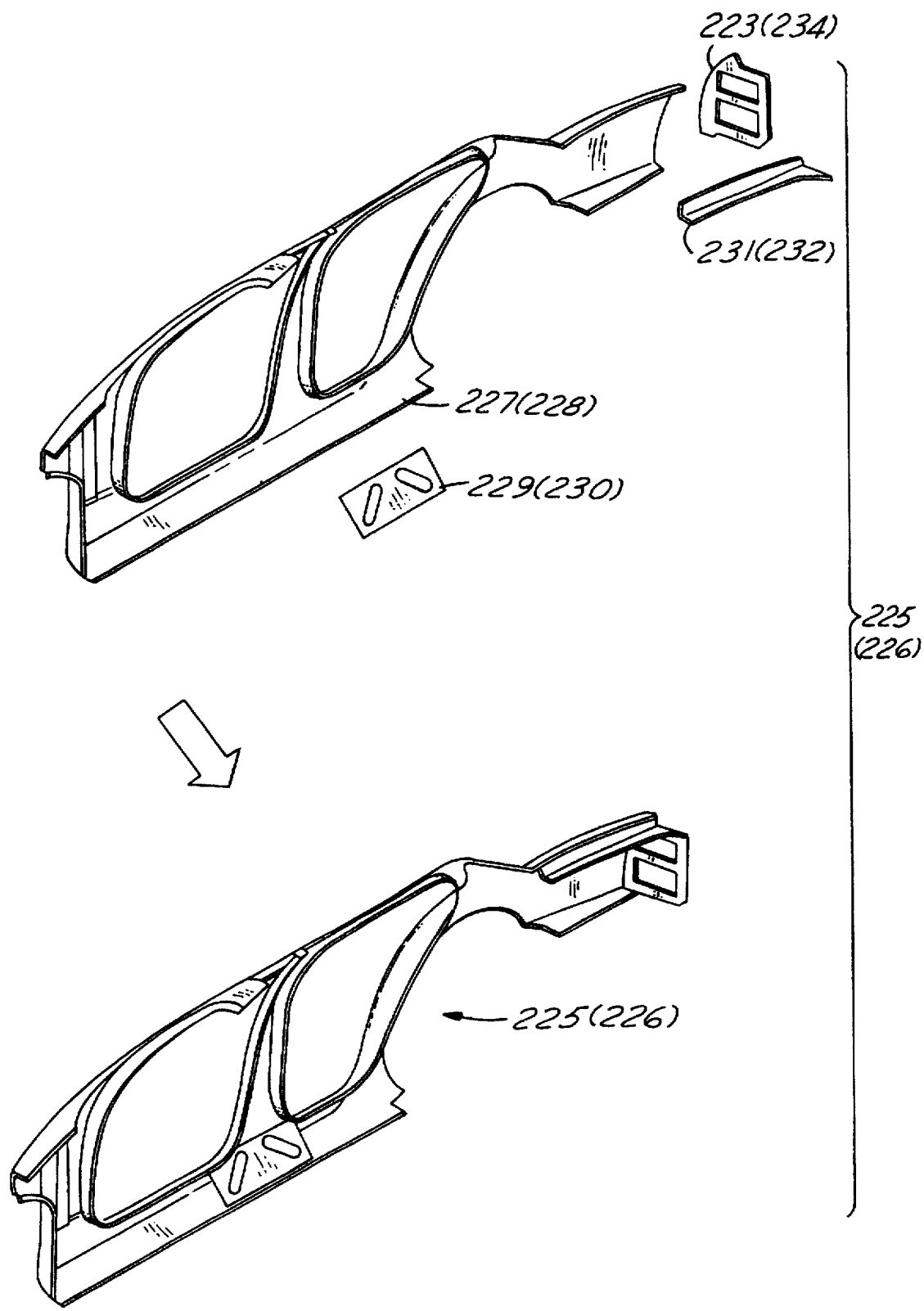

As shown in FIG. 33, the body side outer assemblies 225 (right) and 226 (left) are constructed and completed. The assemblies 225 and 226 are constructed by placing door opening panels 227 (R) and 228 (L), B-pillar lower reinforcement members 229 (R) and 230 (L), deck lid gutter members 231 (R) and 232 (L), and quarter panel extension members 233 (R) and 234 (L) in an appropriate fixture and spot welding them together.

Figure 34:
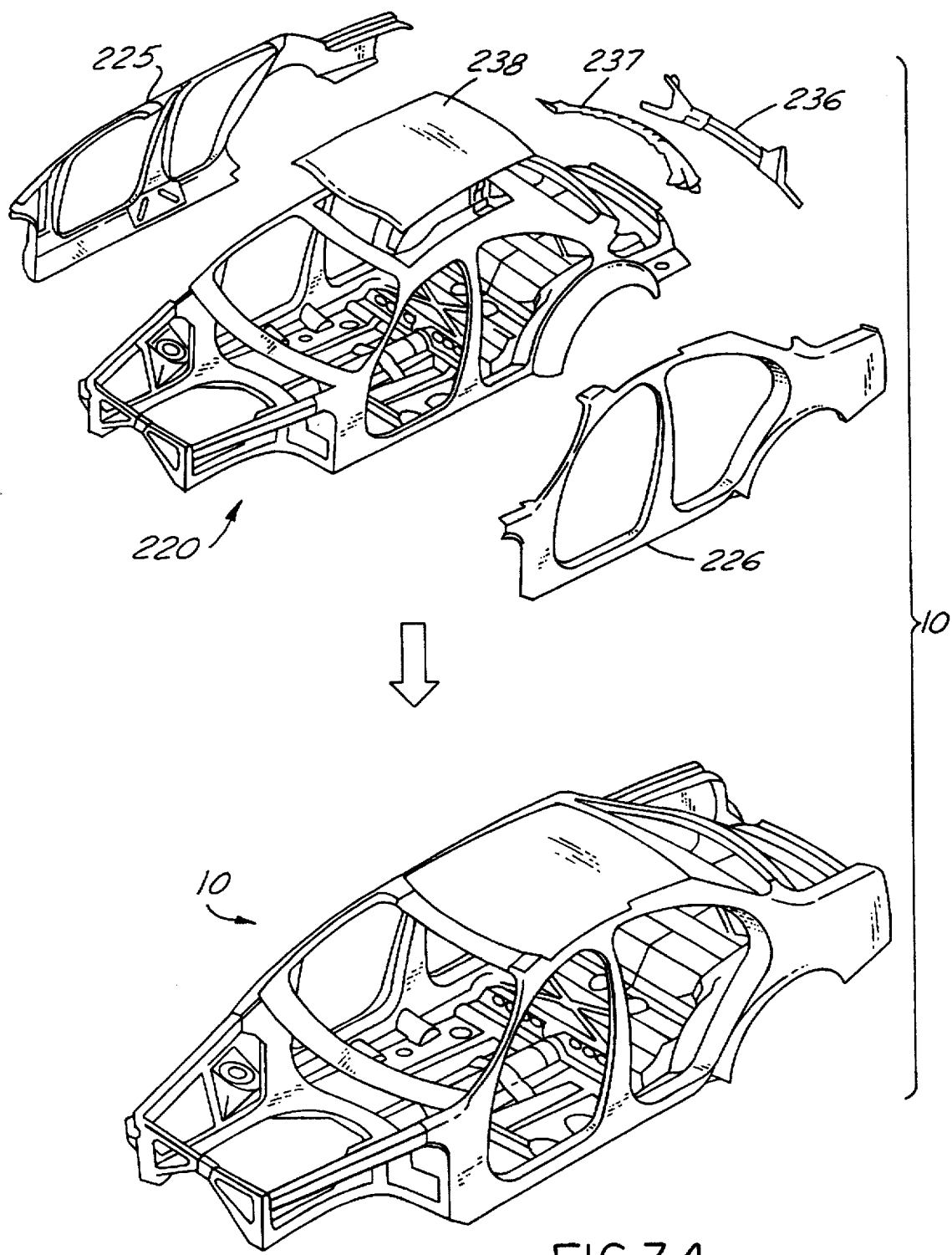

Subsequently, the final assembly process is carried out, as shown in FIG. 34, to complete the body-in-white 10. The body side outer assemblies 225 and 226, along with the lower back panel member 336 and package tray panel member 237 are loaded onto the framing assembly 220 (as shown in FIG. 32) and spot welded together. Finally, the roof panel 238 is laser welded to form the complete body-in-white.

Figure 35:
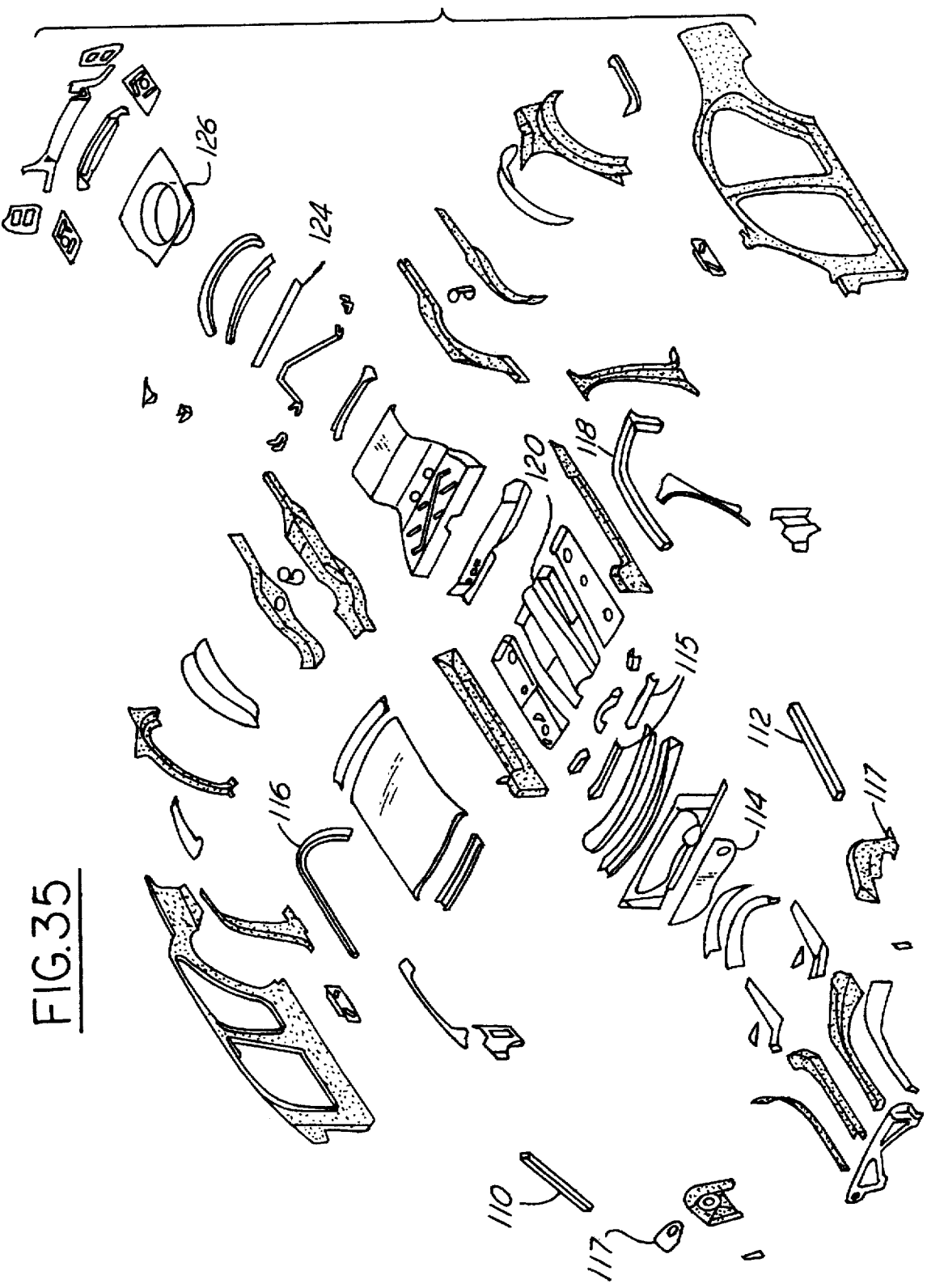
FIG. 35 illustrates an exploded view of a preferred body-in-white embodiment developed in accordance with the present invention.

FIG. 35 illustrates in an exploded view all of the components of a preferred embodiment of a body-in-white 250 made primarily of steel material in accordance with the present invention. All of the components of the body-in-white 250 are made entirely from steel materials, except for the dash panel member 114, center floor pan member 120 and spare tire wheel tub member 126, which are made of a laminated material (a polypropylene core between two thin panels of a steel material). Of the remaining components, the package tray cross member 124 is made of a roll formed steel material, the two front rail members 110 and 112 and the two side roof rail members 116 and 118 are made from hydroformed steel materials, and the two front shock tower reinforcing members 117 and 117 and the two front floor pan reinforcing members 115 and 115 are made of hot formed steel materials. In addition, all of the parts indicated by stippling are tailor blanked parts. All of the remaining parts not specifically mentioned in the BIW 250 are made by conventional deep drawn stamping processes.

Although particular embodiments of the present invention have been illustrated in the accompanying drawings and described in the foregoing detailed description, it is to be understood that the present invention is not to be limited to just the embodiments disclosed, but that they are capable of numerous rearrangements, modifications and substitutions without departing from the scope of the claims hereafter.

What is claimed is:

1. A process for producing a light-weight vehicle body comprising a plurality of components, said process comprising the steps of:
   a. selecting at least one type of material for said components;
   b. selecting structural performance targets;
   c. conducting a beam model analysis;
   d. designing a body-in-white;
   e. creating a shell model;
   f. selecting material gauges for said components;
   g. selecting manufacturing processes for said components;
   h. conducting a first structural analysis;
   i. determining whether said shell model meets said selected structural performance targets;
   j. selecting crash requirements;
   k. creating a crash model;
   l. conducting a crash model analysis;
   m. determining whether said crash model meets said selected crash requirements;
   n. conducting a second structural analysis; and
   o. determining for at least a second time whether said shell model meets said selected structural performance targets.

2. The process in accordance with claim 1 wherein said material for said components comprises a steel material.

3. The process in accordance with claim 2 wherein mild steel is used for at least one component and high-strength steel is used for at least one other component.

4. The process in accordance with claim 1 wherein said material comprises a steel material and said manufacturing processes for said components are selected from the group comprising roll forming, hot forming, tailor blanking, hydro-forming and stamping.

5. The process in accordance with claim 1 wherein said shell model is created utilizing data from various load tests.

6. The process in accordance with claim 1 wherein said crash model analysis comprises conducting computer simulated crash tests selected from the group comprising front crash test, rear crash test, roof crush test and side impact test.

7. The process in accordance with claim 6 wherein said crash test group further comprises at least one off-center crash test.

8. The process in accordance with claim 1 wherein said vehicle body is produced from a combination of unibody and hydroform intensive body design styles.

9. The process in accordance with claim 1 wherein said material for a plurality of said components comprises an aluminum material.

10. The process in accordance with claim 1 wherein said material for a plurality of said components comprises a synthetic material.

11. The process in accordance with claim 10 wherein said synthetic material comprises a plastic material.

12. The process in accordance with claim 1 wherein said material for a plurality of said components comprises a composite material.

13. The process in accordance with claim 1 wherein said material for a first plurality of said components comprises a steel material and said material for a second plurality of said components comprises a laminate material.

14. The process in accordance with claim 13 wherein said laminate material comprises a plastic core positioned between thin metal panel members.

15. The process in accordance with claim 13 wherein said second plurality of said components comprises at least one component selected from the group comprising a dash panel member, a floor panel member, and a wheel tub member.

16. The process in accordance with claim 1 wherein at least one component is made from a laminate material.

17. The process in accordance with claim 1 wherein:
   a. a first plurality of components is made from a stamped steel material;
   b. a second plurality of components is made from a hydroformed steel material.

18. The process in accordance with claim 17 wherein at least one of said stamped steel components is made by a tailor blanking process.

19. The process in accordance with claim 17 wherein at least one of said stamped steel components is made by a hot forming process.

20. The process in accordance with claim 17 further comprising a third plurality of components made from a laminated material.

21. The process in accordance with claim 17 further comprising at least one component made from a roll formed steel material.

22. The process in accordance with claim 1 wherein said selected structural performance targets comprise a prespecified static torsion, a prespecified static bending, a prespecified mass, and a prespecified mode of vibration.

23. The process in accordance with claim 22 wherein said prespecified mass is 200 kg.

24. The process in accordance with claim 22 wherein said prespecified mode of vibration is at least 40 Hz.

25. The process in accordance with claim 1 further comprising the step of revising and modifying said shell model in accordance with said first structural analysis.

26. The process in accordance with claim 1 further comprising the step of revising and modifying said crash model in accordance with said crash model analysis.

27. The process in accordance with claim 1 further comprising the step of revising and modifying said second determination whether said shell model meets said selected structural performance targets.

28. The process in accordance with claim 1 wherein said beam model analysis and said shell model analysis are conducted using computer finite element software.

29. The process in accordance with claim 1 wherein said crash model analysis is conducted using computer simulation software.

30. The process in accordance with claim 29 wherein a supercomputer is utilized to conduct said computer simulation.

31. A process for producing a lightweight body-in-white comprised of a plurality of components, the plurality of components being made of a steel material, said process comprising the steps of:
   a. selecting structural performance targets for the body-in-white;
   b. conducting a finite element beam model analysis to determine the locations and cross-sections of said components;

c. designing a preliminary body-in-white;

d. creating a finite element shell model;

e. selecting the thickness of the material for said components, as well as the manufacturing processes used to produce said components, said shell model having at least a first component made from stamped steel material, at least a second component made from hydroformed steel material, and at least a third component made from a tailor blanked material;

f. conducting a first structural analysis to determine whether said shell model meets said selected structural performance targets;

g. modifying said shell model where necessary in accordance with said first structural analysis;

h. selecting crash requirements for said body-in-white;

i. creating a finite element crash model;

j. conducting a computer simulated crash model analysis to determine whether said crash model meets said selected crash requirements; and k. conducting a second structural analysis and modifying said shell model where necessary in accordance with said crash model analysis and said second structural analysis.

* * * * *

Disclaimer and Dedication 5,729,463—Gerhard Koenig, Birmingham; Robert Koehr, Mt. Clemens; Felix Kybart, Birmingham, all of Michigan; Sigfried Walter, Leonberg, Germany; John Catterall, Troy; John Krumbach, Plymouth, both of Michigan; Rolf Heyll, Renningen, Germany; Andrew Wolf, Parkland, Florida. DESIGNING AND PRODUCING LIGHTWEIGHT AUTOMOBILE BODIES. Patent dated March 17, 1998. Disclaimer and Dedication filed May 29, 1998, by the assignee, ULSAB Trust.

Hereby disclaims and dedicates to the Public all claims of said patent.
*(Official Gazette, July 14, 1998)*